United States Patent
Endres

(10) Patent No.: US 9,977,335 B2
(45) Date of Patent: May 22, 2018

(54) ILLUMINATION OPTICAL UNIT FOR PROJECTION LITHOGRAPHY

(71) Applicant: Carl Zeiss SMT GmbH, Oberkochen (DE)

(72) Inventor: Martin Endres, Koenigsbronn (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days. days.

(21) Appl. No.: 15/440,265

(22) Filed: Feb. 23, 2017

(65) Prior Publication Data

US 2017/0160641 A1   Jun. 8, 2017

Related U.S. Application Data

(63) Continuation of application No. PCT/EP2015/069134, filed on Aug. 20, 2015.

(30) Foreign Application Priority Data

Sep. 3, 2014 (DE) .................. 10 2014 217 611

(51) Int. Cl.
*G03F 7/20* (2006.01)

(52) U.S. Cl.
CPC .......... *G03F 7/702* (2013.01); *G03F 7/70033* (2013.01); *G03F 7/70075* (2013.01); *G03F 7/70116* (2013.01)

(58) Field of Classification Search
CPC ... G03F 7/70191; G03F 7/702; G03F 7/70075
USPC .................. 355/52, 53, 55, 67–71
See application file for complete search history.

(56) References Cited

U.S. PATENT DOCUMENTS

| | | |
|---|---|---|
| 2006/0132747 A1 | 6/2006 | Singer et al. |
| 2011/0085151 A1 | 4/2011 | Deguenther |
| 2013/0176546 A1* | 7/2013 | Layh .................. G03F 7/70083 355/71 |

(Continued)

FOREIGN PATENT DOCUMENTS

| | | |
|---|---|---|
| DE | 10 2008 009 600 A1 | 8/2009 |
| DE | 10 2009 045 694 A1 | 4/2011 |

(Continued)

OTHER PUBLICATIONS

International Search Report for corresponding PCT Appl No. PCT/EP2015/069134, dated Jan. 5, 2016.

(Continued)

*Primary Examiner* — Hung Henry Nguyen
(74) *Attorney, Agent, or Firm* — Fish & Richardson P.C.

(57) ABSTRACT

An illumination optical unit for projection lithography illuminates an illumination field, in which an object field of a downstream imaging optical unit and an object to be illuminated are arrangeable, with illumination light of an EUV light source. The illumination optical unit includes two facet mirrors for reflecting, overlaid guidance of partial beams of a beam of the EUV illumination light via exactly one facet of one of the two facet mirrors in each case. The facet mirror is a distance from a pupil plane of the illumination optical unit. Individual mirrors of the other facet mirror, which is arranged in, or in the vicinity of, a field plane that is conjugate to the object field, may be grouped into individual mirror groups which are tiltable together.

20 Claims, 18 Drawing Sheets

(56) References Cited

U.S. PATENT DOCUMENTS

2015/0153650 A1    6/2015  Deguenther
2015/0323874 A1*  11/2015  Saenger .............. G02B 5/3083
                                                      355/71
2016/0187786 A1*   6/2016  Patra .................. G02B 26/0833
                                                      355/67

FOREIGN PATENT DOCUMENTS

DE    10 2012 213 515 A1   2/2014
WO    WO 2010/099807 A1    9/2010

OTHER PUBLICATIONS

German Office Action, with translation thereof, for corresponding DE Appl No. 10 2014 217 611.5, dated Feb. 20, 2015.

* cited by examiner

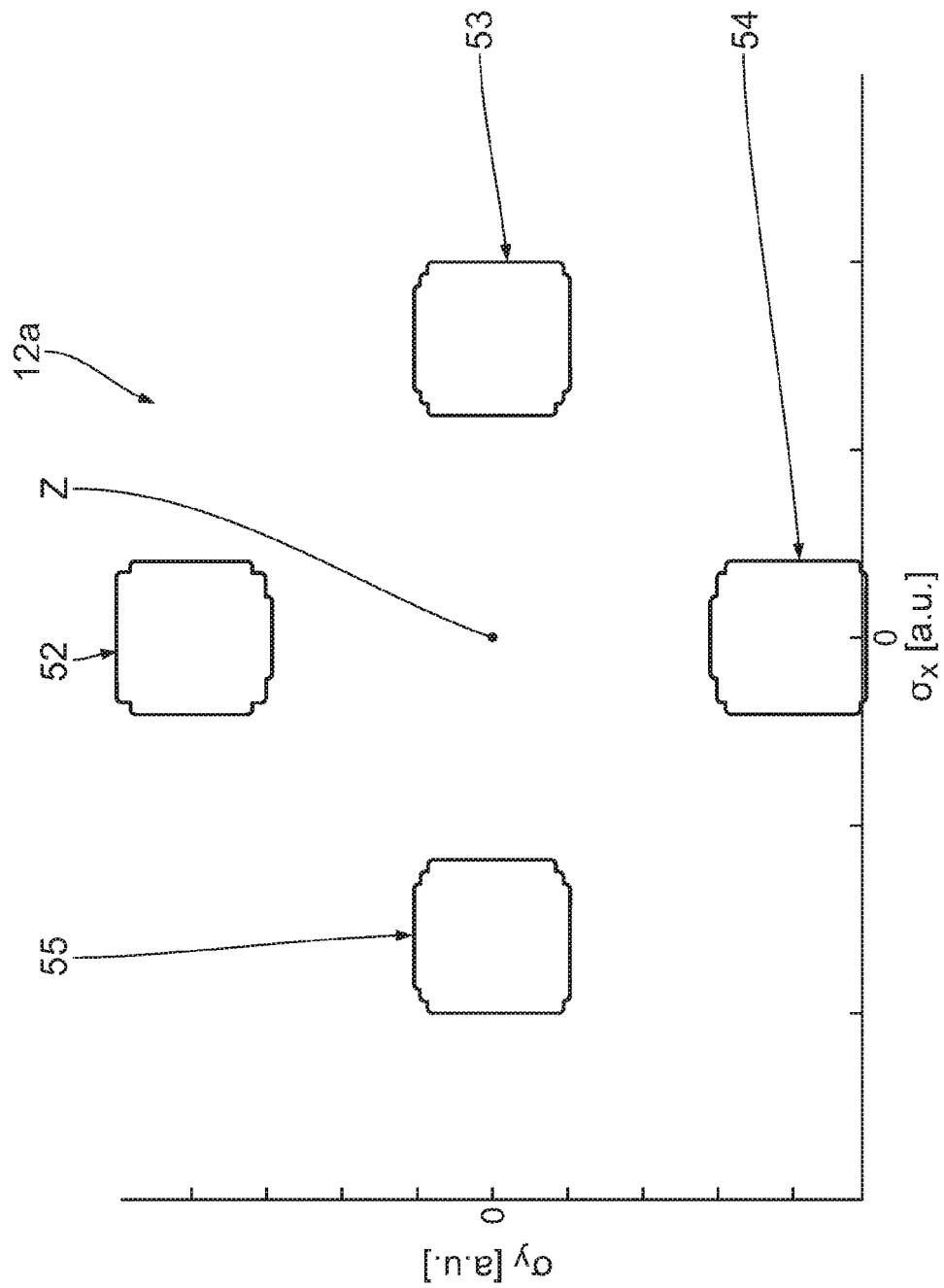

ILLUMINATION OPTICAL UNIT FOR PROJECTION LITHOGRAPHY

CROSS-REFERENCE TO RELATED APPLICATIONS

The present application is a continuation of, and claims benefit under 35 USC 120 to, international application PCT/EP2015/069134, filed Aug. 20, 2015, which claims benefit under 35 USC 119 of German Application No. 10 2014 217 611.5, filed Sep. 3, 2014. The entire disclosure of international application PCT/EP2015/069134 and German Application No. 10 2014 217 611.5 are incorporated by reference herein.

FIELD

The disclosure relates to an illumination optical unit for projection lithography. Furthermore, the disclosure relates to a method for determining assignments of individual mirror groups of a first facet mirror to facets of a further facet mirror for illuminating an illumination field when using such an illumination optical unit, an optical system including such an illumination optical unit, an illumination system including such an illumination optical unit, a projection exposure apparatus including such an optical system, a method for producing a micro- or nanostructured component, and a component produced by the method.

BACKGROUND

An illumination optical unit including a transfer optical unit and at least one illumination predefinition facet mirror disposed downstream is known from WO 2010/099807 A1 and US 2006/0132747 A1.

SUMMARY

The present disclosure seeks to develop an illumination optical unit in such a way that great flexibility is attained when predefining an illumination of the illumination field.

In one aspect, the disclosure provides an illumination optical unit for projection lithography for illuminating an illumination field, in which an object field of a downstream imaging optical unit and an object to be illuminated are arrangeable, with illumination light of an EUV light source. The illumination optical unit includes a first facet mirror with a multiplicity of individual mirrors arranged next to one another. The individual mirrors, for the purposes of predefining a predefined illumination of the illumination field, are individually tilted and grouped to form individual mirror groups which are tiltable together. The illumination optical unit also includes a further facet mirror with a plurality of individually tiltable further facets arranged next to one another. The two facet mirrors are embodied for reflecting, overlaid guidance of partial beams of a beam of the EUV illumination light to the object field, in each case via exactly one of the further facets. The first facet mirror is arranged in or near a field plane which is conjugate with respect to the object field. The further facet mirror is arranged at a distance from a pupil plane of the illumination optical unit. The grouping of the individual mirror groups is such that at least one of the individual mirror groups which guides one of the partial beams to the object field via exactly one of the further facets is formed from a plurality of individual mirror subgroups which are not contiguous on the first facet mirror.

What was identified according to the disclosure is that individual mirror groups of the first field facet mirror need not necessarily be contiguous so that the illumination light from the respective individual mirror group is guided to the object field in accordance with the predefined illumination via one and same further facet of the further facet mirror arranged at a distance from the pupil plane. In the case of predefined illumination angle distributions, so-called illumination settings, in which light should reach the object field from different illumination poles in particular, it was found to be advantageous to allow individual mirror groupings on the first facet mirror which are built up from a plurality of non-contiguous individual mirror subgroups. Then, the individual mirror subgroups belonging to the same individual mirror group are transferred, namely imaged in particular, via one and same further facet into different, and routinely spatially separated, regions of the object field. An improved usability of the further facet mirror emerges. The further facet mirror is also referred to as a specular reflector. The facets of the further facet mirror are also referred to as further facets or specular facets. These facets of the further facet mirror, in turn, may be formed from a plurality of individual mirrors in each case, which, when acting together, form the respective further facet or specular facet and transfer, and in particular image, an individual mirror group of the first facet mirror into the object field in a predefined manner. The grouping of the individual mirror groups may be such that a plurality of individual mirror groups with, in each case, a plurality of non-contiguous individual mirror subgroups are present. To the extent that the further facet mirror has more than 100 further facets, more than 1% of the individual mirror groups may be non-contiguous. A higher percentage is also possible, for example more than 1.5%, more than 2%, up to 10% or else an even higher percentage. A non-contiguous individual mirror group may be formed from two, three or even more individual mirror subgroups. The second, further facet mirror which is arranged at a distance from a pupil plane of the illumination optical unit is not arranged in a field plane or a plane, conjugate thereto, of the illumination optical unit or of a downstream projection optical unit. Grouping the individual mirrors of the first facet mirror to individual mirror groups which are tiltable together means that the grouped individual mirrors within the respective group each have a fixedly predefined tilt angle which follows from the functional group membership. Here, this need not relate to the identical tilt angle; however, this regularly relates to tilt angles which differ a little at best. The individual mirrors being tiltable together within an individual mirror group does not mean, or at least does not necessarily mean, that these individual mirrors are all tilted by one and same actuator. As a rule, each individual mirror within an individual mirror group has a dedicated tilt actuator. Assigning the individual mirrors in individual mirror groups is carried out by way of a central controller of the illumination optical unit and depends on the respective illumination parameters to be set.

The individual mirror groups can cover a far field of the beam of the EUV illumination light by more than 80%. Such a far-field coverage leads to a particularly efficient use of the EUV illumination light. The far-field coverage may be better than 85%, better than 90%, or may be even better.

An assignment of the individual mirror groups to the further facets can be such that selection individual mirrors of at least one of these individual mirror groups are displaceable between: a first tilting position, in which the selection individual mirrors reflect illumination light to a first one of the further facets for object-field illumination purposes; and a second tilting position, in which the selection individual mirrors reflect illumination light to a second one of the further facets for object-field illumination purposes. The first one and/or the second one of the further facets also guides illumination light from at least one further individual mirror group to the object field, in addition to the illumination light guided by the selection individual mirrors. Considering selection individual mirrors in such an assignment increases an assignment flexibility, which may be used to optimize the illumination setting and/or else optimize an occupancy of the first facet mirror with individual mirror groups and/or reduce a thermal load on the further facets. Tilting of the further facets is not necessary when tilting the selection individual mirrors between the first tilting position and the second tilting position. The selection individual mirrors may be less than 50% of all individual mirrors of the first facet mirror. It is also possible for the selection individual mirrors to make up a smaller proportion of the totality of the individual mirrors of the first facet mirror, for example at most 20%. Such proportions of the selection individual mirrors lead to the option of flexibly occupying the first facet mirror with the individual mirror groups such that the first facet mirror may be used with a high far-field coverage. A degree of the filling of the pupils of the illumination optical unit, i.e. the proportion of illuminated regions of an entry pupil to an overall area of the entry pupil, may be kept low. Moreover, a fine adjustment of illumination properties of the illumination optical unit is possible. This may relate to selection individual mirrors, even in the case where a proportion of the individual mirrors of the individual mirror groups is greater than 20% or 50%. In principle, it is even possible for all individual mirrors to have the function of such selection individual mirrors.

A design of the illumination optical unit for illuminating an object which is displaceable in an object displacement direction, wherein the individual mirror groups or the individual mirror subgroups can be delimited in such a way that edges of the individual mirror groups or of the individual mirror subgroups include an angle with the object displacement direction which is greater than 20°. Predefining individual mirror groups delimited in such a manner makes a scan-integrated illumination less sensitive, in particular in relation to drifting normal vectors of the further facets.

The first facet mirror can have a plurality of individual mirror blocks, wherein a block interstice is present between two of the individual mirror blocks in each case with the block interstice having greater extent than a mirror interstice between two neighboring individual mirrors within one of the individual mirror blocks, wherein less than 80% of all block interstices lie in the interior of individual mirror groups or individual mirror sub-groups. Occupying the first facet mirror with individual mirror groups in such a manner reduces the influence of block interstices imaged into the object field. A stability and a through-put of the illumination are improved.

In one aspect, the disclosure provides a method for determining assignments of individual mirror groups of a first facet mirror to facets of a further facet mirror for illuminating an illumination field when using an illumination optical unit described herein. The method includes: a) predefining an illumination intensity distribution in an illumination pupil; b) predefining an illumination or object field extent, including an edge contour of the illumination or object field; c) selecting a first one of the facets of the further facet mirror; d) checking which individual mirrors of the first facet mirror may be used to apply the illumination light to this facet of the further facet mirror for the purposes of illuminating at least some of the illumination or object field; e) allocating those individual mirrors which yielded an illumination solution during the check according to d) to the individual mirror group which is assigned to the selected facet of the further facet mirror; f) repeating c) to e) for all facets of the further facet mirror. Such a method was found to be particularly expedient when assigning the individual mirror groups to the further facets. As a result of the determination method, each one of the facets of the further facet mirror may have assigned thereto exactly one individual mirror group of the first facet mirror. Alternatively, it is possible to make a selection from the facets of the further facet mirror, i.e. an individual mirror group should not be assigned to all of these further facets. By way of example, a selection of the further facets to be assigned predefines the illumination intensity distribution predefined in the initial step.

Instead of a maximum possible individual mirror group size for the object field illumination, a smaller individual mirror group can be formed, at least for some individual mirror groups. The premise of forming individual mirror groups having a maximum size is departed from in such an approach. This increases the flexibility of occupying the first facet mirror with the individual mirror groups, which may be used, for example, to reduce the thermal load on the further facets, improve a far-field coverage on the first facet mirror in the case of the puzzle occupancy with the individual mirror groups or else reduce unwanted imaging of block interstices.

An optical system can include an illumination optical unit as described herein and a projection optical unit for imaging the object field into an image field. A projection exposure apparatus can include such an optical system and a light source. A method for producing a component (e.g., microstructured or nanostructured component) can include using such a projection exposure apparatus. A component (e.g., microstructured or nanostructured component) can be prepared by such a method. The advantages of such an optical system, such an illumination system, of such a projection exposure apparatus, of such a production method, and of such a component (e.g., microstructured or nanostructured component) correspond to those which have already been explained above with reference to the illumination optical unit. The component produced may be a semiconductor element, especially a microchip, in particular a memory chip.

BRIEF DESCRIPTION OF THE DRAWINGS

Exemplary embodiments of the disclosure are explained in greater detail below with reference to the drawing. In the drawing:

FIG. 19 shows, in an illustration similar to FIG. 6, a pupil intensity distribution for a quadrupole illumination setting;

DETAILED DESCRIPTION

Figure 1:
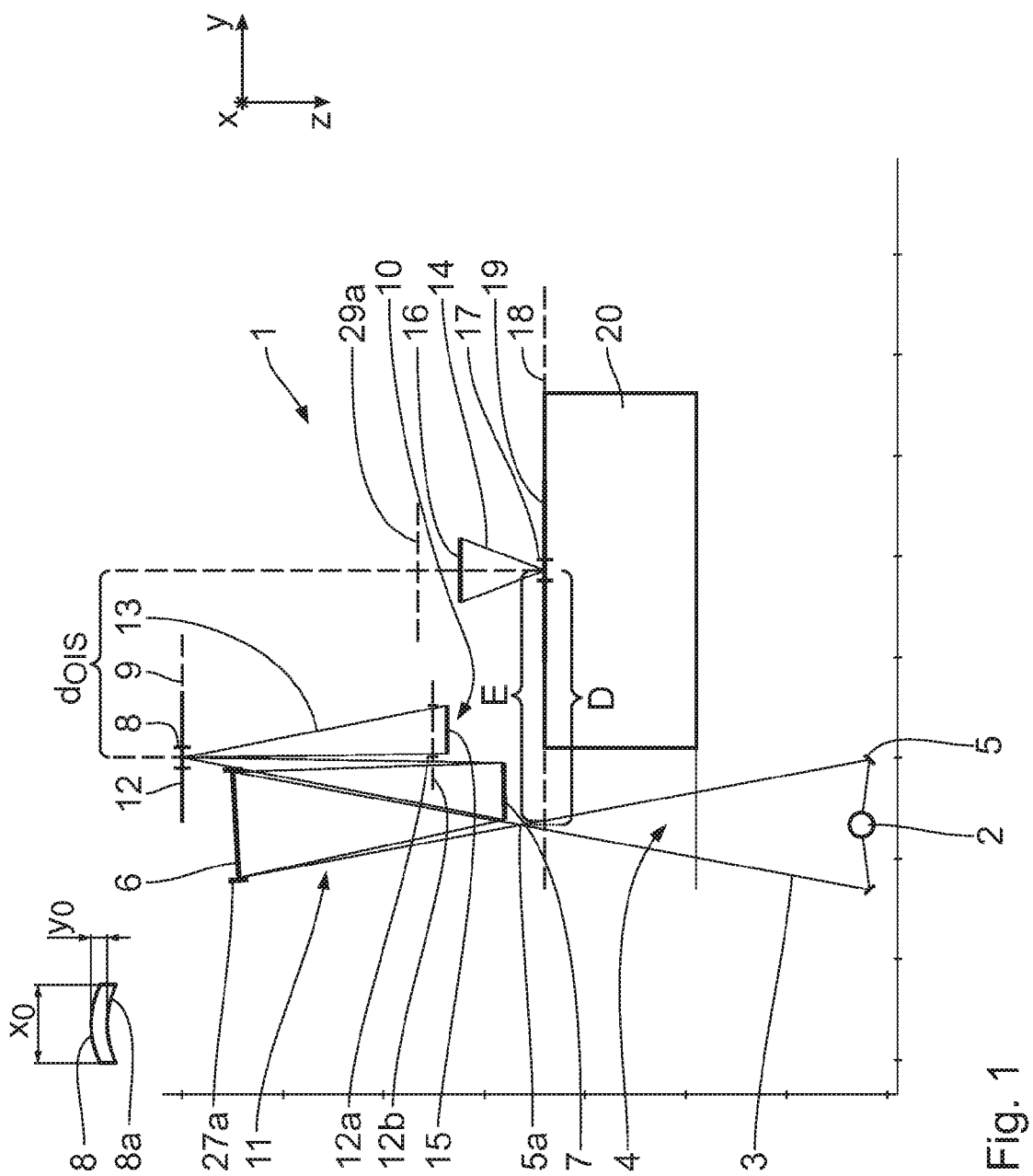
FIG. 1 shows highly schematically in meridional section a projection exposure apparatus for EUV microlithography including a light source, an illumination optical unit and a projection optical unit.

A projection exposure apparatus 1 for microlithography that is illustrated highly schematically and in meridional section in FIG. 1 has a light source 2 for illumination light 3. The light source is an EUV light source which generates light in a wavelength range between 5 nm and 30 nm. Here, this may be an LPP (laser produced plasma) light source, a DPP (discharge produced plasma) light source or a synchrotron radiation-based light source, for example a free electron laser (FEL).

For guiding the illumination light 3, proceeding from the light source 2, use is made of a transfer optical unit 4. The latter has a collector 5, which is illustrated only with regard to its reflective effect in FIG. 1, and a transfer facet mirror 6, which is described in even greater detail below and which is also denoted as first facet mirror or as field facet mirror. An intermediate focus $5a$ of the illumination light 3 is arranged between the collector 5 and the transfer facet mirror 6. A numerical aperture of the illumination light 3 in the region of the intermediate focus $5a$ is NA=0.182, for example. An illumination predefinition facet mirror 7, which is also denoted as second or further facet mirror and is likewise explained in even greater detail below, is disposed downstream of the transfer facet mirror 6 and thus the transfer optical unit 4. The optical components 5 to 7 are parts of an illumination optical unit 11 of the projection exposure apparatus 1.

The transfer facet mirror 6 is arranged in a field plane of the illumination optical unit 11.

The illumination predefinition facet mirror 7 of the illumination optical unit 11 is arranged at a distance from pupil planes of the illumination optical unit 11. Such an arrangement is also denoted as specular reflector.

A reticle 12 is disposed downstream of the illumination predefinition facet mirror 7 in the beam path of the illumination light 3, the reticle being arranged in an object plane 9 of a downstream projection optical unit 10 of the projection exposure apparatus 1. The projection optical unit 10 is a projection lens. The illumination optical unit 11 is used to illuminate an object field 8 on the reticle 12 in the object plane 9 in a defined manner. The object field 8 simultaneously constitutes an illumination field of the illumination optical unit 11. Generally it holds true that the illumination field is formed in such a way that the object field 8 may be arranged in the illumination field.

Like the transfer facet mirror 6 as well, the illumination predefinition facet mirror 7 is part of a pupil illumination unit of the illumination optical unit and serves to illuminate an entrance pupil 12*a* in a pupil plane 12*b* of the projection optical unit 10 with the illumination light 3 with a predefined pupil intensity distribution. The entrance pupil 12*a* of the projection optical unit 10 may be arranged in the illumination beam path upstream of the object field 8 or else downstream of the object field 8. FIG. 1 shows the case in which the entrance pupil 12*a* is arranged in the illumination beam path downstream of the object field 8.

In order to facilitate the presentation of positional relationships, a Cartesian xyz-coordinate system is used hereinafter. The x-direction runs perpendicularly to the plane of the drawing into the latter in FIG. 1. In FIG. 1, the y-direction extends to the right. The z-direction runs downwards in FIG. 1. Coordinate systems used in the drawing have x-axes running parallel to one another in each case. The course of a z-axis of the coordinate systems follows a respective principal direction of the illumination light 3 within the figure respectively under consideration.

The object field 8 has an arcuate or partly circular shape and is delimited by two mutually parallel circle arcs and two straight side edges which run in the y-direction with a length $y_0$ and are at a distance $x_0$ from one another in the x-direction. The aspect ratio $x_0/y_0$ is 13 to 1. An insert in FIG. 1 shows a plan view of the object field 8, this plan view not being true to scale. A boundary shape 8*a* is arcuate. In an alternative and likewise possible object field 8, the boundary shape thereof is rectangular, likewise with aspect ratio $x_0/y_0$.

The projection optical unit 10 is indicated only in part and highly schematically in FIG. 1. An object field side numerical aperture 13 and an image field side numerical aperture 14 of the projection optical unit 10 are illustrated. Between indicated optical components 15, 16 of the projection optical unit 10, which components may be embodied for example as mirrors that are reflective for the EUV illumination light 3, there are situated further optical components—not illustrated in FIG. 1—of the projection optical unit 10 for guiding the illumination light 3 between these optical components 15, 16.

The projection optical unit 10 images the object field 8 into an image field 17 in an image plane 18 on a wafer 19, which, like the reticle 12 as well, is carried by a holder (not illustrated in more specific detail). Both the reticle holder and the wafer holder are displaceable both in the x-direction and in the y-direction via corresponding displacement drives. A structural space requirement of the wafer holder is illustrated as a rectangular box at 20 in FIG. 1. The structural space requirement 20 is rectangular with an extent in x-, y- and z-directions that is dependent on the components to be accommodated herein. The structural space requirement 20 has, for example, proceeding from the center of the image field 17, an extent of 1 m in the x-direction and in the y-direction. In the z-direction, too, the structural space requirement 20, proceeding from the image plane 18, has an extent of 1 m, for example. The illumination light 3 has to be guided in the illumination optical unit 11 and the projection optical unit 10 in such a way that it is in each case guided past the structural space requirement 20.

The transfer facet mirror 6 has a multiplicity of transfer facets 21. The transfer facet mirror 6 may be embodied as an MEMS mirror. The transfer facets 21 are individual mirrors which are switchable at least between two tilting positions and which are embodied as micromirrors. The transfer facets 21 may be embodied as micromirrors tiltable in a driven manner about two rotation axes perpendicular to one another.

Figure 2:
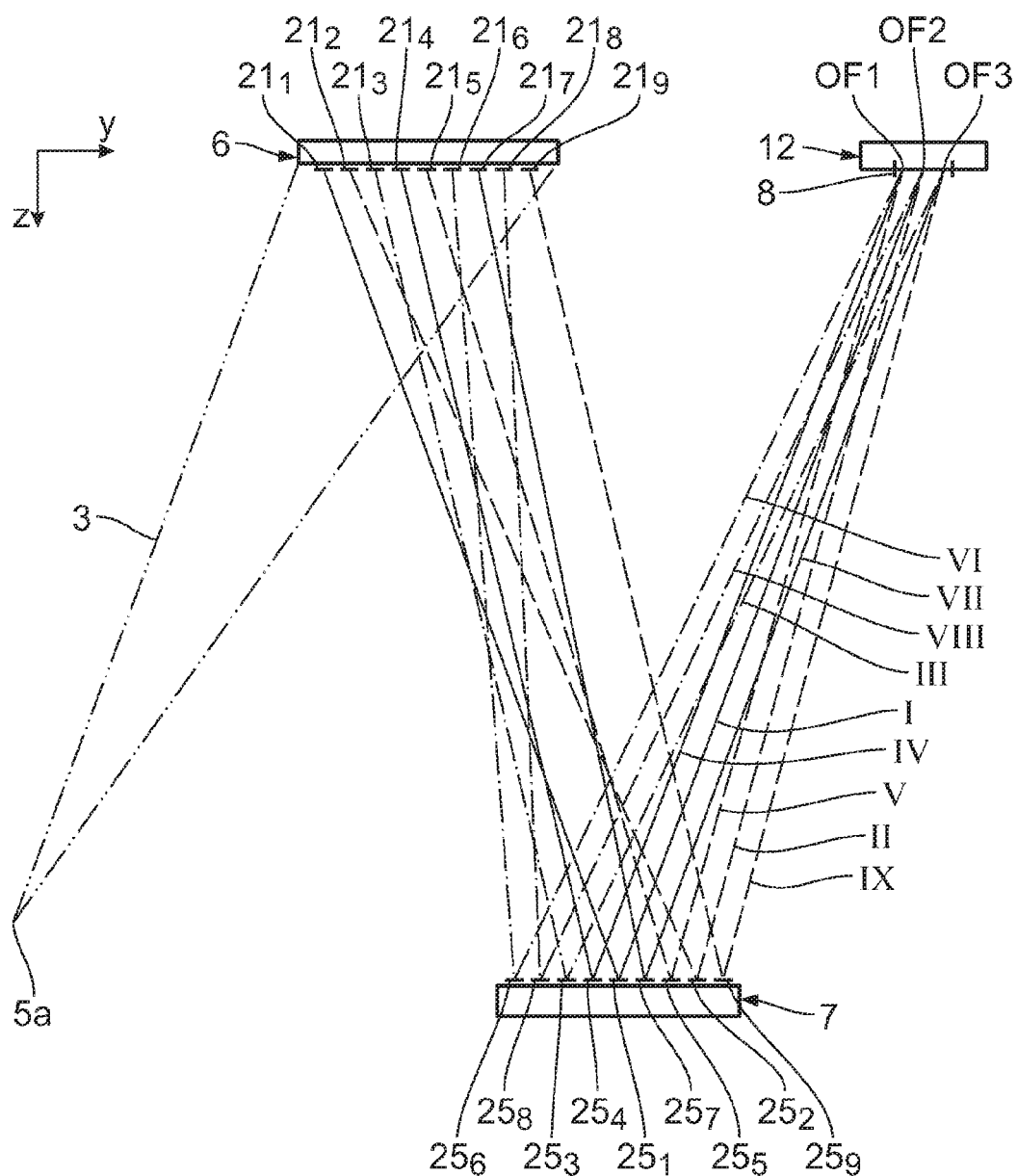
FIG. 2 shows schematically and likewise in meridional section a beam path of selected individual rays of illumination light within a pupil illumination unit of the illumination optical unit according to FIG. 1, proceeding from an intermediate focus through to a reticle arranged in the object plane of the projection optical assembly in the region of an illumination or object field.

From the individual mirrors or transfer facets 21, a line having a total of nine transfer facets 21 is illustrated schematically in the yz-sectional view according to FIG. 2, the transfer facets being indexed from left to right by $21_1$ to $21_9$ in FIG. 2. In actual fact, the transfer facet mirror 6 has a significantly greater multiplicity of the transfer facets 21. The transfer facets 21 are grouped into a plurality of transfer facet groups not illustrated in more specific detail in FIG. 2 (in this respect, cf. in particular FIGS. 4 and 5). These transfer facet groups are also denoted as individual mirror groups, virtual field facets or as virtual facet groups.

Each of the transfer facet groups guides a portion of the illumination light 3 via an illumination channel for partial or complete illumination of the object field 8. With the illumination channel and an illumination light partial beam $3_i$ guided via the latter (cf. e.g. FIG. 8), exactly one illumination predefinition facet 25 of the illumination predefinition facet mirror 7 is assigned in each case to one of the individual mirror groups or transfer facet groups. In principle, each of the illumination predefinition facets 25 may for their part in turn be constructed from a plurality of individual mirrors.

For further details of possible embodiments of the transfer facet mirror 6 and the projection optical unit 10, reference is made to WO 2010/099 807 A.

At least some of the illumination predefinition facets 25 illuminate only a partial zone or partial field of the object field 8. The partial fields are very individually shaped and, moreover, are dependent on the desired illumination direction distribution (pupil shape) in the object field 8, that is to say the illumination setting. The illumination predefinition facets 25 are therefore illuminated by very differently shaped virtual field facets, the shape of which corresponds precisely to the shape of the respective partial field to be illuminated. Moreover, each illumination predefinition facet 25 contributes to different regions of the pupil depending on the location in the object field 8.

The illumination predefinition facet mirror 7 may be embodied as an MEMS mirror, particularly if each of the illumination predefinition facets 25 is constructed from a plurality of individual mirrors. The illumination predefinition facets 25 are micromirrors switchable between at least two tilting positions. The illumination predefinition facets 25 are embodied as micromirrors which are tiltable in a driven manner about two mutually perpendicular tilting axes continuously and independently, that is to say may be positioned into a multiplicity of different tilting positions.

One example of a predefined assignment of individual transfer facets 21 to the illumination predefinition facets 25 is illustrated in FIG. 2. The illumination predefinition facets 25 respectively assigned to the transfer facets $21_1$ to $21_9$ are indexed according to this assignment. The illumination facets 25 are illuminated from left to right on the basis of this assignment in the order $25_6$, $25_8$, $25_3$, $25_4$, $25_1$, $25_7$, $25_5$, $25_2$ and $25_9$.

The indices 6, 8 and 3 of the facets 21, 25 include three illumination channels VI, VIII and III, which illuminate three object field points OF1, OF2, OF3, which are numbered from left to right in FIG. 2, from a first illumination direction. The indices 4, 1 and 7 of the facets 21, 25 belong to three further illumination channels IV, I, VII, which illuminate the three object field points OF1 to OF3 from a second illumination direction. The indices 5, 2 and 9 of the facets 21, 25 belong to three further illumination channels V, II, IX, which illuminate the three object field points OF1 to OF3 from a third illumination direction.

The illumination directions assigned to
the illumination channels VI, VIII, III,
the illumination channels IV, I, VII and
the illumination channels V, II, IX
are identical in each case. The assignment of the transfer facets 21 to the illumination predefinition facets 25 is therefore such that a telecentric illumination of the object field 8 results in the case of the illumination example illustrated pictorially.

The illumination of the object field 8 via the transfer facet mirror 6 and the illumination predefinition facet mirror 7 can be carried out in the manner of a specular reflector. The principle of the specular reflector is known from US 2006/0132747 A1.

The projection optical unit 10 has an object-image offset $d_{OIS}$ of 930 mm. The offset is defined as the distance between a midpoint of the object field 8 and an intersection point of a normal to the midpoint of the image field 17 through the object plane 9. The projection exposure apparatus 1 including the projection optical unit 10 has an intermediate focus-image offset D of 1280 mm. The intermediate focus-image offset D is defined as the distance between the midpoint of the image field 17 and an intersection point of a normal from the intermediate focus 5a to the image plane 18. The projection exposure apparatus 1 including the projection optical unit 10 has an illumination light beam-image offset E of 1250 mm. The illumination light beam-image offset E is defined as the distance between the midpoint of the image field 17 and an intersection region of the illumination light beam 3 through the image plane 18.

Figure 3:
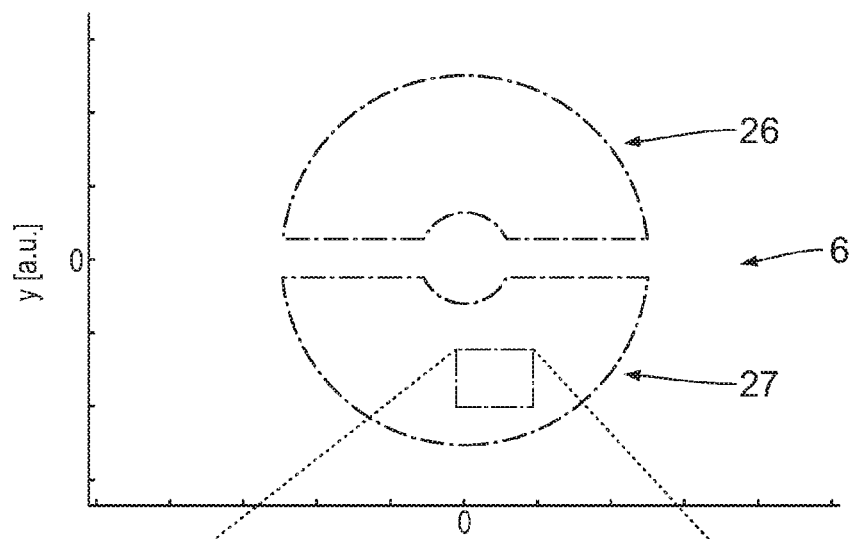
FIG. 3 shows a plan view of a transfer facet mirror of the illumination optical unit, the mirror being arranged in a field plane.

FIG. 3 shows a plan view of the transfer facet mirror 6. The number of transfer facets 21 on the transfer facet mirror 6 is so great that individual transfer facets 21 are not identifiable in FIG. 3. The transfer facets 21 are arranged in blocks in two approximately semicircular facet regions 26, 27 that are illuminated with a far field 27a (cf. FIG. 1) of the illumination light 3.

Figure 4:
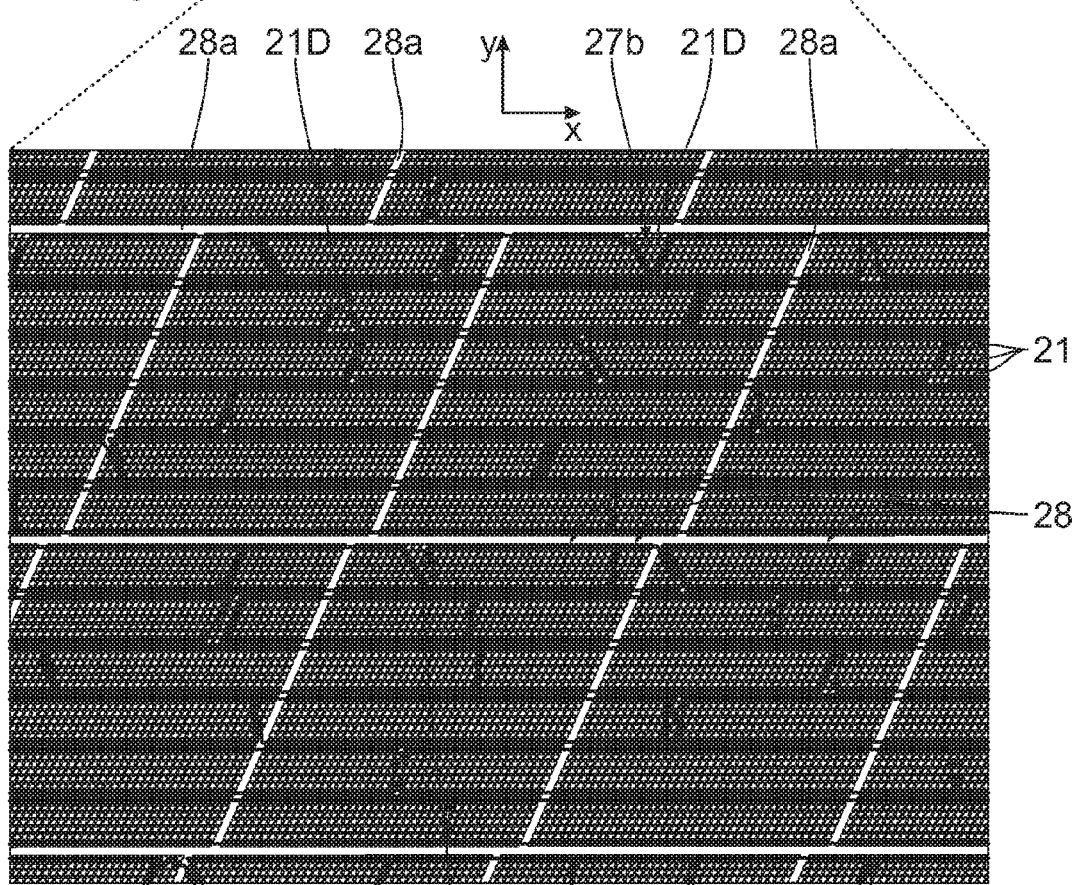
FIG. 4 shows an enlarged excerpt from FIG. 3, which illustrates a subdivision of the transfer facet mirror into individual mirror blocks and highlights an allocation of illuminated sections on the transfer facet mirror which constitute virtual facet groups or individual mirror groups to which illumination predefinition facets of an illumination predefinition facet mirror disposed downstream in the illumination optical unit are assigned via illumination channels, wherein an x-dipole illumination setting is set via the two facet mirrors.

FIG. 4 shows, in an excerpt from FIG. 3, a subdivision of the transfer facet mirror 6 into a plurality of individual mirror blocks 27b each having an edge contour in the form of a parallelogram. Each of the individual mirror blocks 27b has approximately 40×40 of the individual mirrors 21. FIG. 4 furthermore highlights an allocation of the transfer facets 21 to the transfer facet groups 28. A grouping of the transfer facets or individual mirrors 21 of the transfer facet mirror 6 into the transfer facet groups or individual mirror groups 28 is carried out by common tilting of the individual mirrors 21 into a predefined tilting position. The tilting positions of the individual mirrors of exactly one individual mirror group 28 are generally very similar to one another and generally differ more greatly from the tilting positions of adjacent individual mirrors 21 belonging to other individual mirror groups 28. The transfer facet groups 28 are in each case imaged into the object field 8 via the illumination predefinition facet mirror 7. All transfer facets 21 of a respective one of the transfer facet groups 28 illuminate one and the same illumination predefinition facet 25.

The occupation of the transfer facet mirror 6 with transfer facet groups 28 according to FIG. 4 is designed for an illumination pupil of the illumination optical unit 11 with an x-dipole illumination setting. In a pupil plane of the illumination optical unit 11, in the case of such an illumination setting, two illuminated pupil regions spaced apart from one another in a pupil coordinate $\sigma_x$ corresponding to the x-direction are present, which is explained in even greater detail below.

In the case of the occupation according to FIG. 4, the transfer facet groups 28 are predominantly rectangular.

The individual mirror groups 28 cover the far field 27a of the EUV illumination light 3 at the location of the transfer facet mirror 6 by more than 80%. Coverages by more than 85%, by more than 90% or even higher coverages still are possible.

In FIG. 4, the transfer facets 21 have the shape of parallelograms which, like the individual mirror blocks 27b as well, are sheared perpendicular to the scan direction. The transfer facets 21 are seated on facet carrier components that form the individual mirror blocks 27b. Block interstices 28a of the individual mirror blocks 27b may be identified as wide white bars without transfer facets 21 in horizontal and oblique orientation in FIG. 4. The block interstices 28a have a greater extent than mirror interstices between two individual mirrors 21 situated alongside one another adjacently within one of the individual mirror blocks 27b. The transfer facet groups 28 are identified by boundary lines having the course of polygonal chains. The transfer facet groups 28 usually extend across a plurality of individual mirror blocks 27b. For the present x-dipole illumination setting, the transfer facet groups 28 are predominantly almost rectangular or trapezium-shaped and have only very small gaps of unused individual mirrors 21 between adjacent transfer facet groups 28. The gaps between the individual transfer facet groups 28 are illustrated in more than proportional size in FIG. 4. The area proportion of the gaps in relation to the area of the entire facet carrier components is less than 10%.

The transfer facet groups 28 serve for illuminating a rectangular object field 8. The illumination predefinition facets 25 serve for the reflective, superimposing guidance of partial beams of the illumination light 3 towards the object field 8. A position of the respective illumination predefinition facet 25 on the illumination predefinition facet mirror 7 predefines an illumination direction for the field points of the object field 8. An x-extent of the transfer facet groups 28 is such that the image of the respective transfer facet group 28 maximally covers the entire object field 8 in the x-direction. The same correspondingly holds true for the y-extent of the transfer facet groups 28. As may be gathered from the enlarged excerpt according to FIG. 4, there are many transfer facet groups 28 whose x-extent is smaller than a maximum possible x-extent, and so an image of the transfer facet groups 28 in the object field 8 in the x-dimension illuminates only a part of the object field 8.

Depending on the illumination setting to be predefined via the illumination optical unit 11, there exists for each illumination predefinition facet 25, that is to say for each illumination channel, a maximum partial zone or partial field of the object field 8 which may be illuminated by the given illumination channel from directions that are contained in the illumination setting to be predefined. This maximum partial field size may attain the size of the entire object field 8, but in particular in the x-direction can also be smaller than the x-extent of the object field 8.

Figure 5:
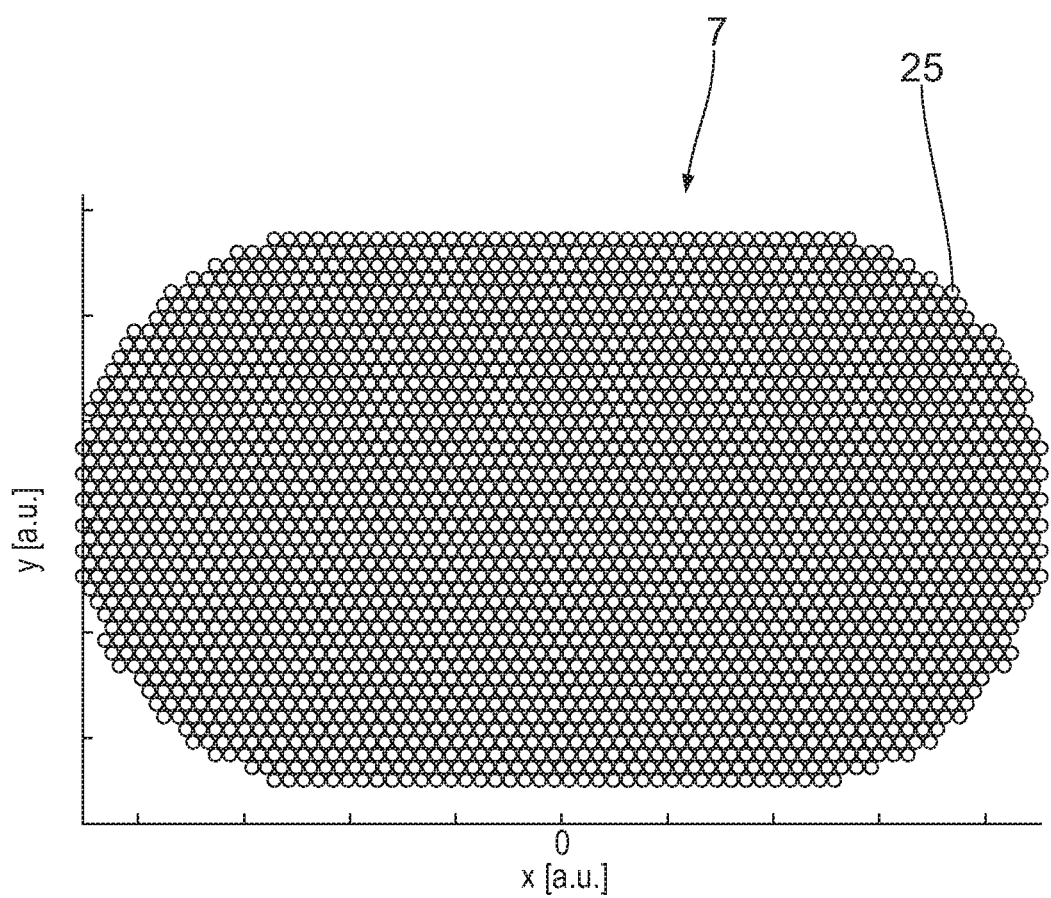
FIG. 5 shows a plan view of the illumination predefinition facet mirror of the illumination optical unit, the mirror being arranged at a distance from a pupil plane of the illumination optical unit.

FIG. 5 shows a plan view of the illumination predefinition facet mirror 7. The illumination predefinition facets 25 are round and are arranged in hexagonal close packed fashion on a carrier (not illustrated in more specific detail) of the illumination predefinition facet mirror 7. An edge contour of this arrangement of the illumination predefinition facets 25 on the carrier of the illumination predefinition facet mirror 7 deviates from the circular shape and is stadium-shaped, for example.

Figure 6:
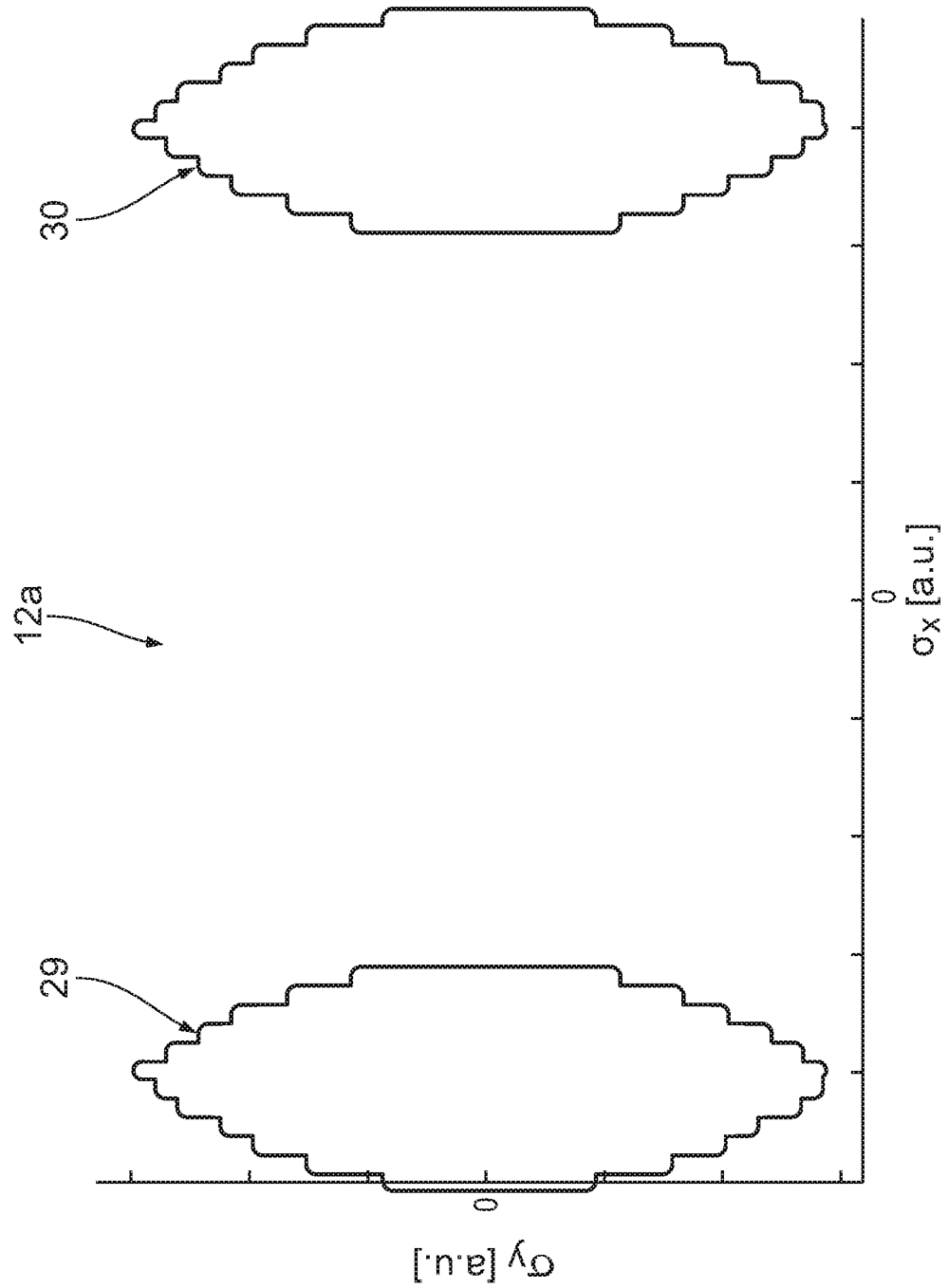
FIG. 6 shows a pupil intensity distribution for an x-dipole illumination setting, plotted over pupil coordinates $\sigma_x$ and $\sigma_y$.

FIG. 6 shows a typical illumination of an illumination pupil 12a of the illumination optical unit 11, which coincides with the entrance pupil of the projection optical unit 10, and is correspondingly arranged in the pupil plane 12b in the beam path of the illumination light 3 downstream of the object field 8 (cf. FIG. 1). The pupil 12a is spanned by pupil dimensions $\sigma_x$, $\sigma_y$, assigned to the object field dimensions x, y.

FIG. 6 shows an x-dipole illumination setting having illumination poles 29, 30. The illumination poles 29, 30 each have a biconvex-lens-shaped cross section having a maximum $\sigma_x$-extent in the region of a central σ-coordinate of the pupil 12a.

Figure 7:
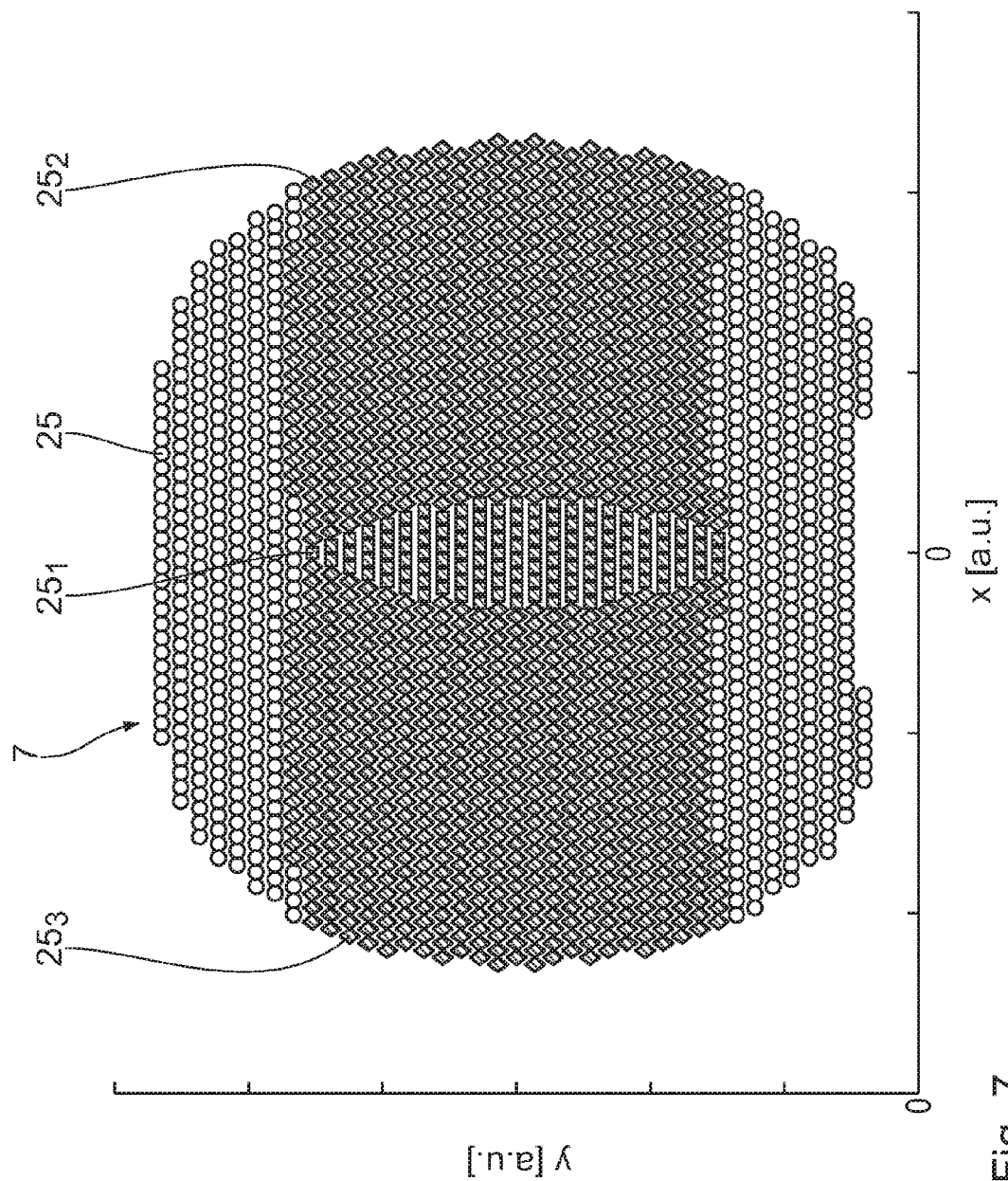
FIG. 7 shows, in an illustration similar to FIG. 5, an embodiment of the illumination predefinition facet mirror, with illumination predefinition facets which are impinged upon by the illumination light by way of respectively assigned individual mirror groups of the transfer facet mirror being highlighted, the highlighting depending on the number of subgroups belonging to an individual mirror group in each case.

Apart from arrangement details relating to the illumination predefinition facets 25, FIG. 7 shows an embodiment of the illumination predefinition facet mirror 7 corresponding to FIG. 5. The empty circles denote illumination predefinition facets 25 which are not used during the illumination with the x-dipole illumination setting according to FIG. 6. Those illumination predefinition facets which are respectively subjected to illumination by exactly one contiguous individual mirror group 28 via an illumination channel are plotted as diamonds $25_2$, $25_3$. A y-extent of the region of used illumination predefinition facets according to FIG. 7 correlates with the $\sigma_y$-extent of the illumination poles 29, 30 of the x-dipole pupil according to FIG. 6.

Lying in the center of the x-dipole impingement scheme of the illumination predefinition facet mirror 7 according to FIG. 7, there is a biconvex-lens-shaped region of illumination predefinition facets 25, of which each one of the illumination predefinition facets 25 is subjected to illumination by exactly two non-contiguous individual mirror subgroups which, together, form an individual mirror group. These illumination predefinition facets which are subjected to illumination by two individual mirror subgroups in each case are elucidated in FIG. 7 by squares $25_1$.

Figure 8:
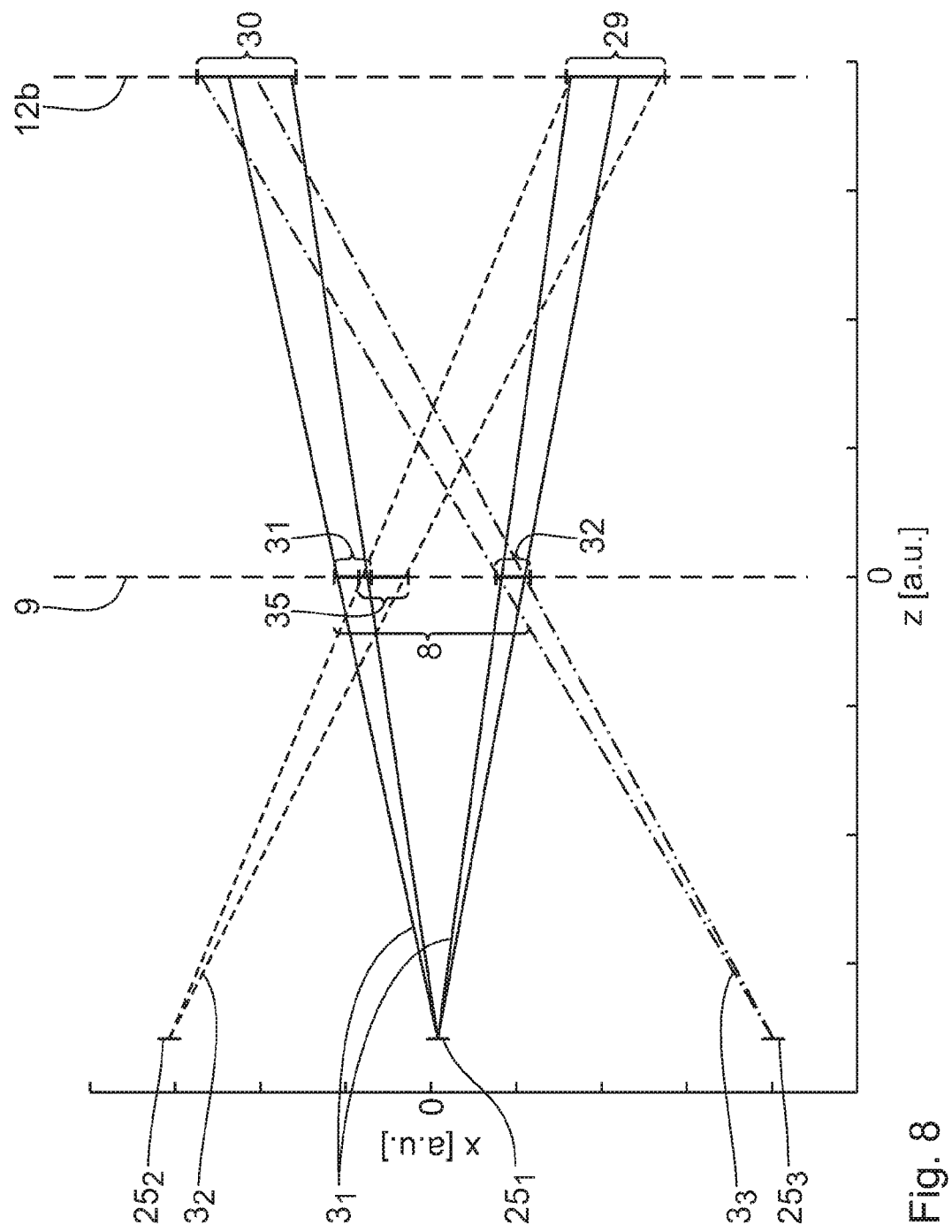
FIG. 8 shows unfolded beam paths of the EUV illumination light between individual illumination predefinition facets and an entry pupil plane of the projection optical unit arranged downstream of the object plane in the beam path.

FIG. 8 shows beam paths between selected illumination predefinition facets 25 of the impingement scheme according to FIG. 7 and the pupil plane 12b in an unfolded, schematic illustration, in which the reflection at the reticle 12 in the object plane 9 remains unconsidered.

The beam path proceeding from a central illumination predefinition facet $25_1$, which is also denoted like this in FIG. 7, is depicted using a full line, the beam path proceeding from an illumination predefinition facet $25_2$ arranged in the region of positive x-values, which is also denoted like this in FIG. 7, is depicted using a dashed line and the beam path proceeding from an illumination predefinition facet $25_3$ arranged in the region of negative x-values, which is also denoted like this in FIG. 7, is depicted using a dash-dotted line.

Two partial field sections 31 and 32 of the entire object field 8 are illuminated in the object plane 9 by way of the illumination predefinition facet $25_1$. In the region of the upper partial field section 31 in FIG. 8, the beam path of the illumination predefinition facet $25_1$ is delimited from large x-values by the object field 8 itself and delimited from small x-values by the illumination pole 30. The beam path assigned to the partial field section 32 is delimited from large x-values by the illumination pole 29 and delimited from small x-values by the object field 8.

An assignment of the individual mirror group 28, which belongs to the illumination predefinition facet $25_1$, is carried out by identifying those individual mirrors 21 on the transfer facet mirror 6 which are imaged into the partial field sections 31 and 32 by way of the illumination predefinition facet $25_1$. In practical terms, this may be brought about by arranging an appropriate stop configuration with a stop in the object plane 9 and a further stop in the pupil plane 12b, the stop configuration reproducing the desired object field form on the one hand and the desired pupil form on the other hand.

The partial beams $3_1$, $3_2$ and $3_3$ of the illumination light 3 are respectively assigned to the facets $25_1$, $25_2$ and $25_3$, the partial beams being guided via the illumination predefinition facets $25_1$ to $25_3$. A superposition of all of these partial beams $3_1$ to $3_3$ and all other partial beams $3_i$ of the other illumination predefinition facets $25_i$ yields the desired illumination of the object field 8 with the predefined illumination setting, that is to say with an x-dipole setting in this case.

Figure 9:
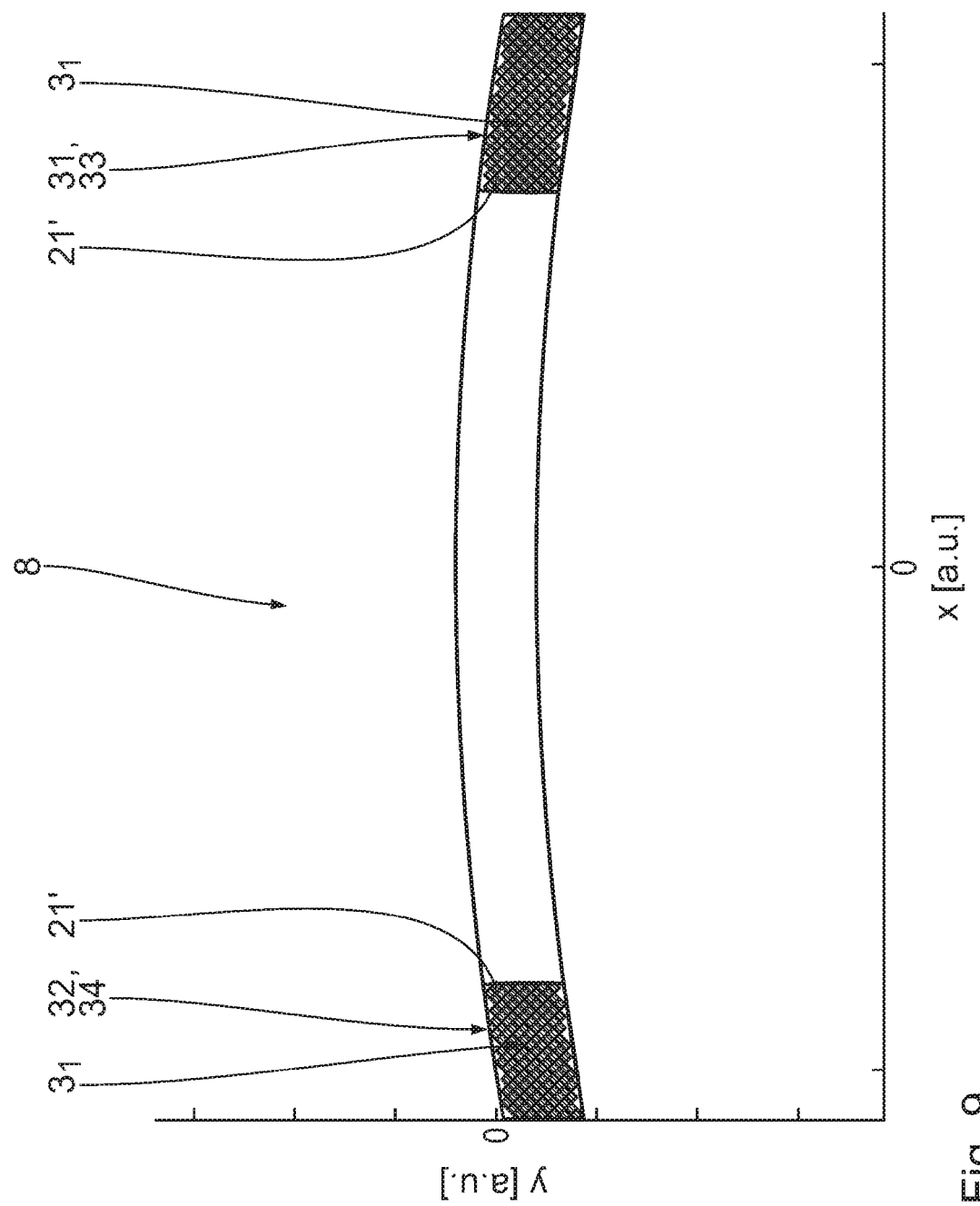
FIG. 9 shows, in a magnified manner, a section through the beam path, proceeding from the central illumination predefinition facet according to FIG. 8, in the object plane, i.e. a partial field illuminated by way of this illumination predefinition facet, into which the individual mirror group of the transfer facet mirror assigned to this illumination predefinition facet is imaged, the individual mirror group having two individual mirror subgroups.

FIG. 9 shows the whole object field 8, having an arcuate embodiment in this embodiment, with the non-contiguous partial field sections 31, 32 which are illuminated by way of the illumination predefinition facet $25_1$. Corresponding individual mirror subgroups 33, 34 on the transfer facet mirror 6 are assigned to the partial field sections 31 and 32 by way of the imaging effect of the illumination predefinition facet $25_1$, the images of which are depicted in FIG. 9 within the partial field sections 31, 32. Since FIG. 9 reproduces images of the individual mirrors 21, these images are denoted by 21' in FIG. 9. A square tessellation of the individual mirrors 21 which is tilted by 45° and which may be used instead of the parallelogram occupancy according to FIG. 4 can be seen in FIG. 9.

The beam paths which run over the two further illumination predefinition facets $25_2$, $25_3$ according to FIG. 8 emerge from corresponding construction prescriptions.

The beam path of the illumination predefinition facet $25_2$ illuminates a contiguous partial field 35 in the object field 8, which is delimited from large x-values and small x-values by the extent of the illumination pole 29. An individual mirror group 28 on the transfer facet mirror 6 is assigned to this partial field 35 in turn by way of the imaging effect of the illumination predefinition facet $25_2$.

A contiguous partial field which practically coincides with the partial field section 32 is illuminated via the third illumination predefinition facet $25_3$ depicted in FIG. 8. In respect of the beam path of the illumination pre-definition facet $25_3$, this partial field 32 is delimited from large x-values by the extent of the illumination pole 30 and from small x-values by the object field 8 once again. The individual mirror group 28 on the transfer facet mirror 6 assigned once again to the partial field 32 may be assigned by way of the imaging effect of the illumination predefinition facet $25_3$.

In this way, it is possible, initially, to assign exactly one contiguous partial field, or precisely two partial field sections, to each illumination predefinition facet 25, depending on the position of the illumination predefinition facet 25 on the illumination predefinition facet mirror 7 and, then, to assign individual mirror groups 28 on the transfer facet mirror 6 to these partial fields or partial field sections, the individual mirror groups 28 either being formed as contiguous individual mirror groups or having two non-contiguous individual mirror subgroups in the style of individual mirror subgroups 33, 34. The position of the individual mirror groups 28 on the transfer facet mirror 6 may still be varied by way of a tilt angle of the illumination predefinition facets 25. In this manner, a puzzle of individual mirror groups 28 which is as complete as possible is produced on the transfer facet mirror 6 when assigning the individual mirror group 28 to all illumination predefinition facets 25, with a goal being that of using the individual mirrors 21 of the transfer facet mirror 6 as completely as possible.

Figure 10:
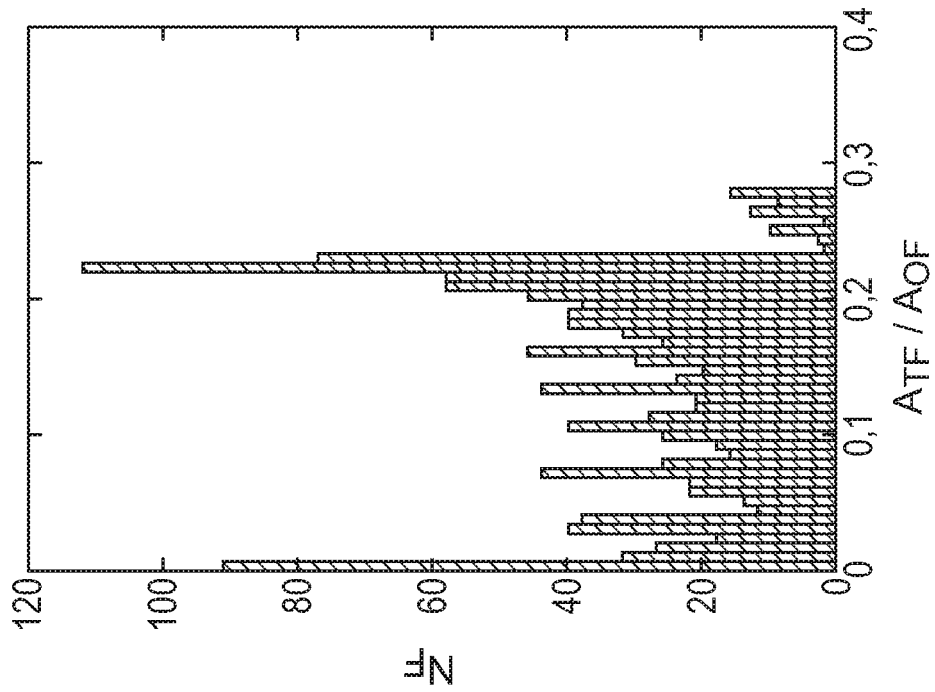
FIG. 10 shows a frequency distribution of the illumination predefinition facets depending on the partial field size respectively illuminated via these illumination predefinition facets in a histogram, plotted relative to the area of the entire object field.

FIG. 10 shows a frequency distribution relating to the area proportion of the respective partial fields, for example the partial fields 31, 32, of an entire area of the object field 8. A histogram shows how many illumination predefinition facets (number $N_F$) respectively illuminate a specific area proportion $A_{TF}$ of the entire object field) surface $A_{OF}$. This frequency distribution applies to the x-dipole illumination according to FIG. 6. A significant maximum of the illumination predefinition facets illuminate a partial field surface $A_{TF}$ which is slightly more than 20% of the entire object field surface $A_{OF}$. Only relatively few illumination predefinition facets illuminate larger area proportions.

Figure 11:
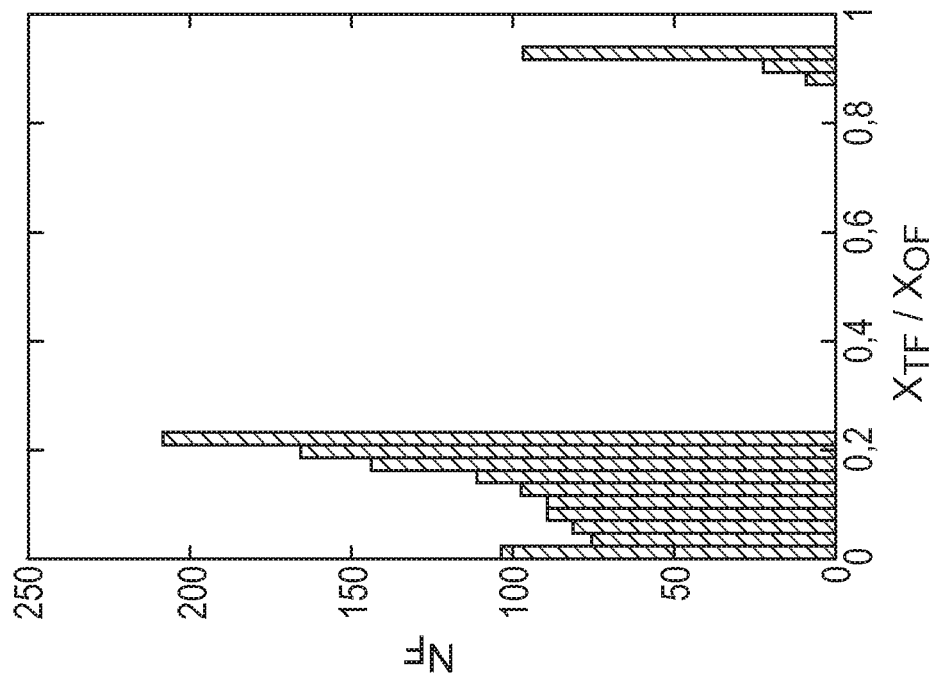
FIG. 11 shows, likewise in a histogram, the frequency distribution of the illumination predefinition facets depending on a maximum extent $X_{TF}$ of partial fields in each case illuminated by way of one of the illumination predefinition facets, measured perpendicular (x) to an object displacement direction y of the reticle, plotted relative to the overall object field extent $X_{OF}$ perpendicular to the object displacement direction.

FIG. 11 shows a frequency distribution of the illumination predefinition facets in relation to the maximally different, illuminated x-coordinates on the object field 8. This illustration facilitates making a clear distinction between the illumination predefinition facets 25 which are illuminated by way of simply contiguous individual mirror groups 28 and illumination predefinition facets 25 which are illuminated by way of individual mirror groups 28 made of two individual mirror subgroups since the latter illuminate a region $X_{TF}$ between the minimum and maximum x-coordinate on the object field 8, which practically corresponds to the entire x-extent $X_{OF}$ of the object field 8 ($X_{TF}/X_{OF} \cong 1$).

In a manner comparable to FIGS. 6 to 11, FIGS. 12 to 18 show the corresponding illumination conditions in the case of a hexapole illumination setting.

Figure 12:
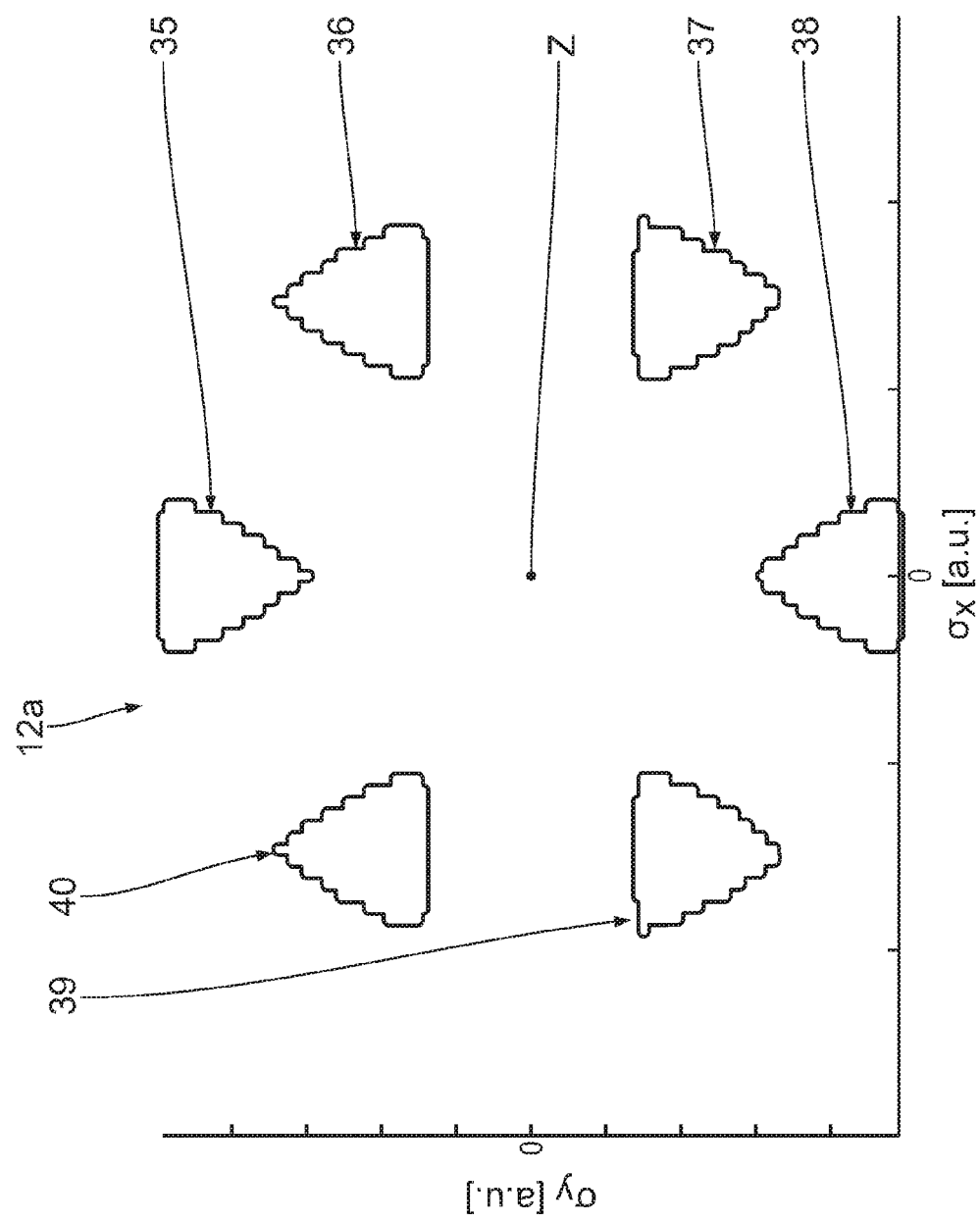
FIG. 12 shows, in an illustration similar to FIG. 6, a pupil intensity distribution for a hexapole illumination setting.

FIG. 12 shows the illumination intensity distribution of the hexapole illumination setting in $\sigma_x$, $\sigma_y$-coordinates. A total of 6 illumination poles 35 to 40 are present in the pupil 12a, the illumination poles being enumerated in the clockwise direction in FIG. 12, starting with the uppermost illumination pole 35 therein. The illumination poles 35 to 40 have a uniform distribution in the circumferential direction, i.e. they are arranged offset by 60° in the circumferential direction about a center Z of the pupil 12a in each case.

Figure 13:
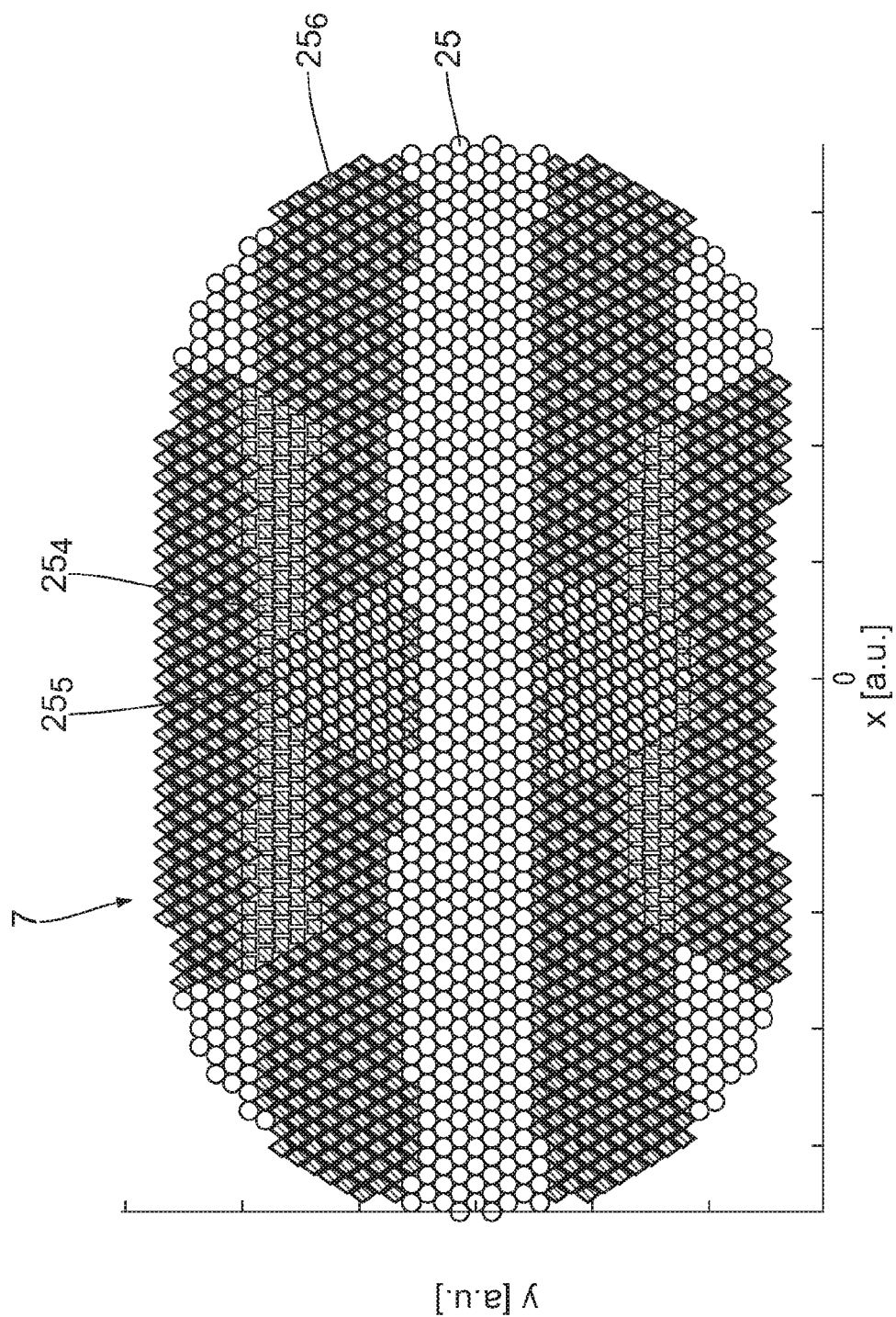
FIG. 13 shows, in an illustration similar to FIG. 7, an impingement of the illumination predefinition facets in the hexapole setting according to FIG. 12.

FIG. 13 shows, in an illustration similar to FIG. 7, an illumination scheme of the illumination predefinition facet mirror 7 for the hexapole illumination setting. The illumination predefinition facets 25 outside of a central band of unused illumination predefinition facets 25, which lies in a region of a central y-coordinate of the illumination predefinition facet mirror 7, are illuminated.

A vast majority of the used illumination predefinition facets are subjected to illumination by a contiguous individual mirror group 28 of the transfer facet mirror 6 in each case, indicated in FIG. 13 by a diamond shape $25_5$, $25_6$ of the illumination predefinition facets. In the region of central used y-coordinates in each case, there is a relatively narrow band of illumination predefinition facets 25 which are illuminated by individual mirror groups 28 from three individual mirror subgroups and are elucidated in FIG. 13 by squares $25_4$.

In the region of central x-coordinates and near the central unused region of the illumination predefinition facet mirror 7, there are two regions with illumination predefinition facets 25 which are subjected to illumination using individual mirror groups 21 of the transfer facet mirror 6, which are each made up of two individual mirror subgroups. These regions are denoted by hatched round illumination predefinition facets $25_5$ and have approximately the approximately triangular form of the hexapole illumination poles.

Figure 14:
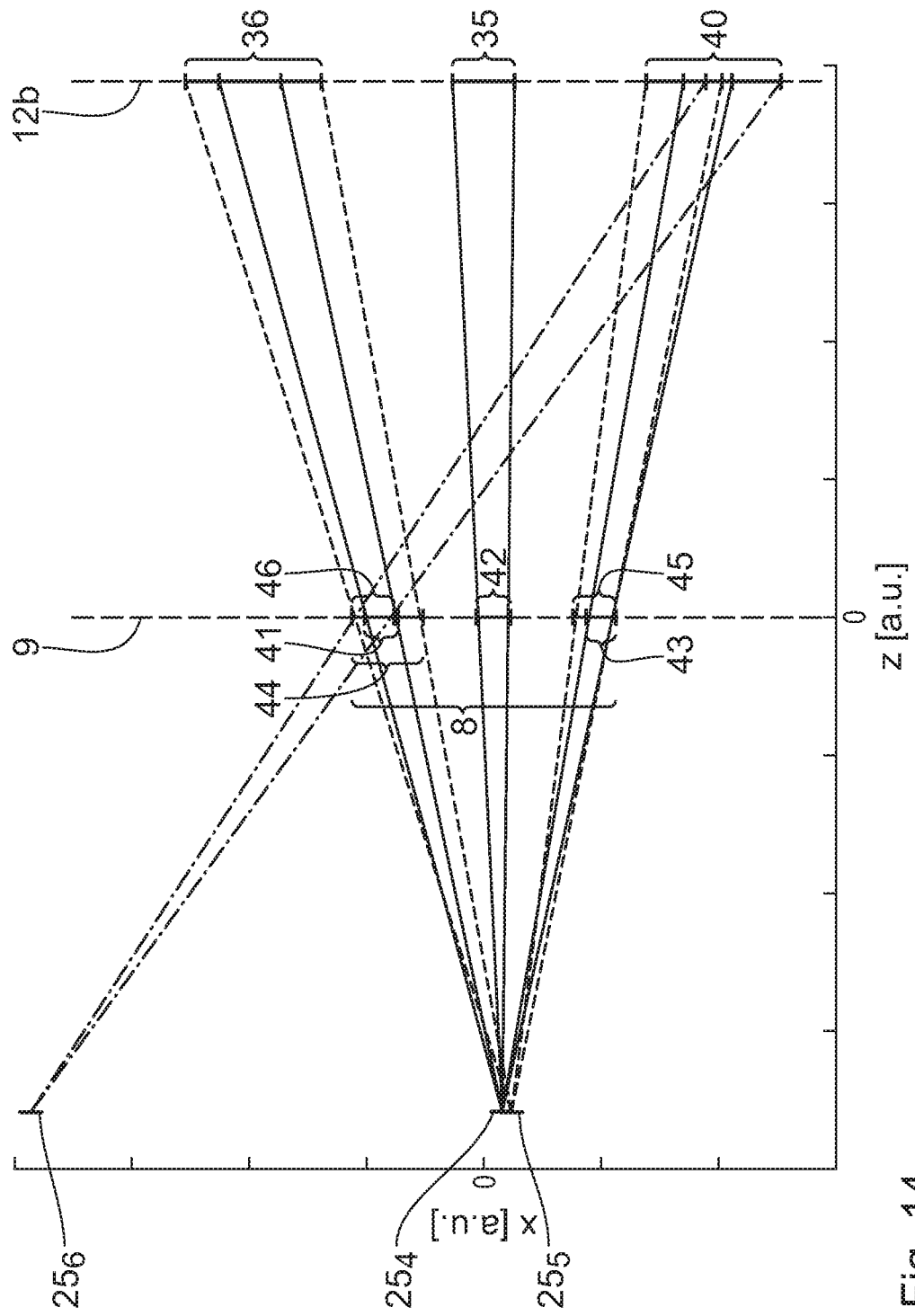
FIG. 14 shows, in an illustration similar to FIG. 8, beam paths, proceeding from three selected illumination predefinition facets via the object field to the entry pupil plane of the projection optical unit, in the case of the hexapole illumination setting according to FIG. 12.

FIG. 14 shows, in an exemplary manner, beam paths of an illumination predefinition facet $25_4$ which is subjected to illumination by three individual mirror subgroups (full lines), of an illumination predefinition facet $25_5$ which is subjected to illumination by two individual mirror subgroups (dashed lines) and an illumination predefinition facet $25_6$ which is subjected to illumination by a simply contiguous individual mirror group 28 (dash-dotted lines), in an illustration similar to FIG. 8. The illumination predefinition facets $25_4$, $25_5$ and $25_6$ are also denoted like this in FIG. 13. The illustration in FIG. 14 is idealized to the extent that the same $x(\sigma_x)$-extent is assumed for the beam paths of all illumination predefinition facets $25_4$ to $25_6$ for all illumination poles 35, 36, 40 illustrated therein. In fact, this is only the case if—more or less randomly—the respective illumination predefinition facets $25_4$ to $25_6$ illuminate the predefined illumination pupil 12a at the same level of the $\sigma_y$-coordinate such that this then results in the same $x(\sigma_x)$-extent of the respective illumination pole 35, 36, 40 in each case. In fact, as may be identified in the overview with FIG. 12, the $\sigma_x$-extent of the respective illumination pole 35 to 40 depends on the $\sigma_y$-coordinate.

The partial field sections 41, 42 and 43 are subjected to illumination by way of the illumination predefinition facet $25_4$.

The partial field section 41 is smaller than a partial field section of maximum size, which would be delimited by the object field or by the illumination pole 36. This may be used for reducing a thermal load on the illumination predefinition facet $25_4$, or else for improving a far-field coverage on the transfer facet mirror 6 by an improved puzzle possibility or else for reducing an image of block interstices 28a on the object field 8. Alternatively, FIG. 13 may show a beam path situation in relation to the illumination predefinition facet $25_4$ in which the illumination pole 36 for this illumination predefinition facet $25_4$ has a smaller $x(\sigma_x)$-extent than for the other illumination predefinition facets $25_5$, $25_6$.

The partial field section 42 is delimited by the illumination pole 35 from both sides, i.e. from small and large x-values.

The partial field section 43 is delimited by the object field 8 from small x-values and, for large x-values, it is smaller than a maximum partial field section 45 which can be subjected to illumination maximally by the illumination predefinition facet $25_4$. The reasons for such a use of a small partial field section were already discussed above in conjunction with the partial field section 41.

Individual mirror subgroups of the individual mirror group 28 on the transfer facet mirror 6 may once again be allocated to the partial field sections 41 to 43, the individual mirror group being assigned to this illumination predefinition facet $25_4$.

Figure 15:
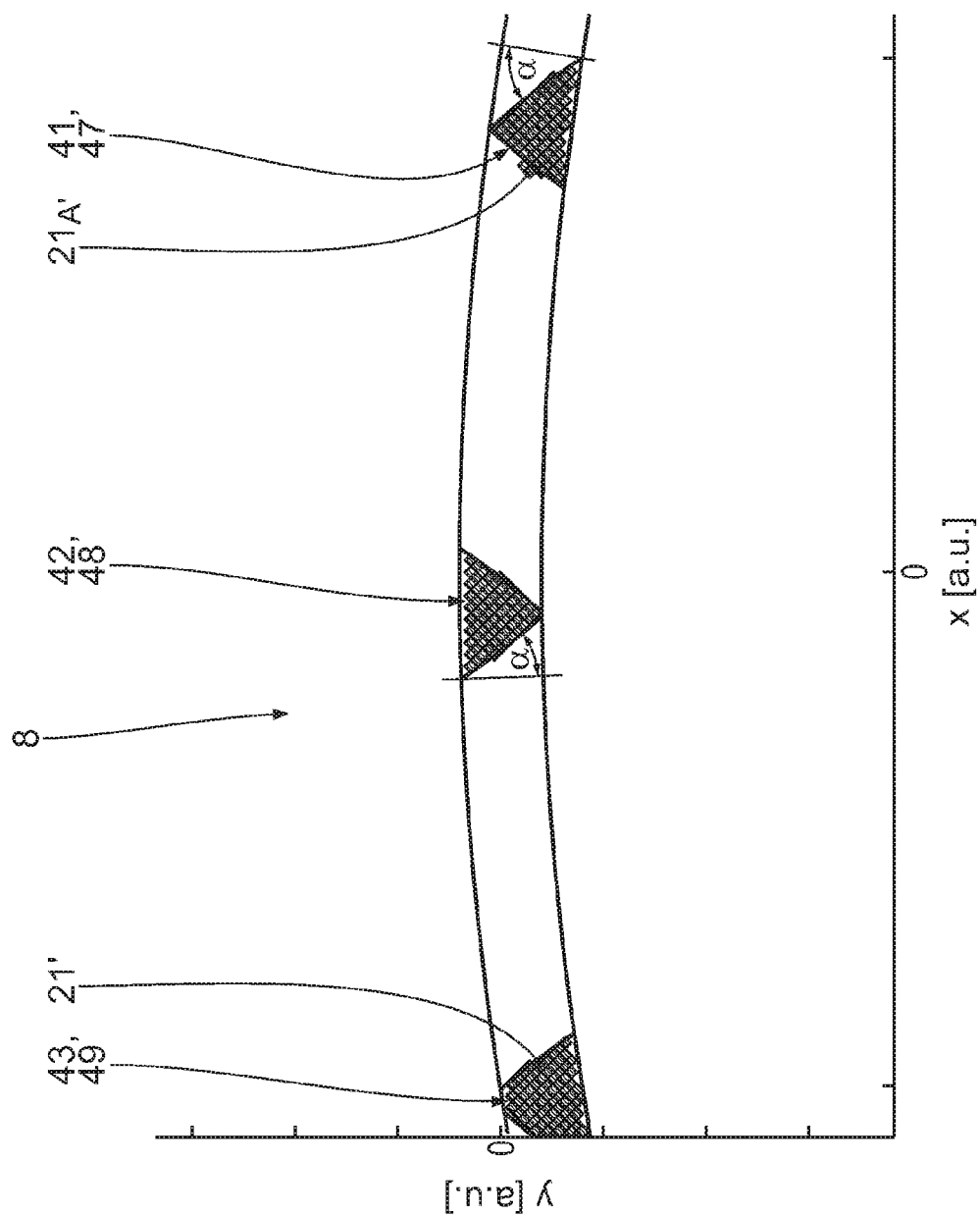
FIG. 15 shows, in an illustration similar to FIG. 9, the impingement of the object field by a partial field by way of an individual mirror group of the transfer facet mirror, including three individual subgroups, in the case of the hexapole illumination setting according to FIG. 12.

This subdivision into the partial field sections 41 to 43 and the assigned individual mirror subgroups 47 to 49 is elucidated by FIG. 15. The partial field sections 41 to 43 are similar to the illumination poles of the hexapole illumination setting. Edges of the illumination poles of the hexapole illumination setting according to FIG. 12 in this case define the edges of the partial field sections 41 to 43 or the edges of the assigned individual mirror subgroups 47 to 49.

As already explained above, the partial field portion 41, for example, is not delimited by the object field 8 or by the illumination pole 36. Accordingly, the assigned individual mirror subgroup 47 is smaller than an individual mirror subgroup with a maximum size, by which a larger partial field with a maximum extent or a partial field section with a maximum extent could be illuminated by way of the illumination predefinition facet $25_4$. The images $21_{4'}$ of such further individual mirrors $21_{4'}$, which likewise may contribute to this illumination of a correspondingly enlarged partial field section 41, are depicted in FIG. 15 for two individual mirrors.

These assigned individual mirrors $21_A$ may be used as selection individual mirrors and may be adjustable between a plurality of tilting positions, wherein, in a first tilting position, they cause the impingement of the illumination light 3 on a first illumination predefinition facet, for example an illumination predefinition facet spatially distant from the illumination predefinition facet $25_4$, for object field illumination purposes and, a second tilting position, in which these selection individual mirrors $21_A$ impinge a second of the illumination predefinition facets, for example the illumination predefinition facet $25_4$, with the illumination light 3 for object field illumination purposes. Thus, in the second tilting position, the selection individual mirrors $21_A$ would belong to the individual mirror subgroup 47. In the first tilting position, the selection individual mirrors $21_A$ would belong to another individual mirror group which is assigned to a different illumination predefinition facet to the illumination predefinition facet $25_4$. This other illumination predefinition facet has a tilt angle which is fixedly assigned by way of this further individual mirror group, for which the selection individual mirrors $21_A$ belong to the first tilting position. Thus, there need not be any tilting of illumination predefinition facets $25_i$ when changing between the various tilting positions of the selection individual mirrors $21_A$.

Up to 20% of the individual mirrors 21 of the transfer facet mirror 6 may be such selection individual mirrors $21_A$. A correspondingly increased flexibility emerges when predefining the illumination setting which, in particular, may be used for homogenizing an intensity distribution over the object field 8. A reduction of a thermal load on heavily loaded illumination predefinition facets $25_i$ is also possible. Furthermore, it is possible to influence the edge contour of the individual mirror subgroups by way of the selection individual mirrors $21_A$. This may be used to produce individual mirror subgroups which fit well to one another when occupying the transfer facet mirror 6, which has a positive influence on the far-field coverage of the transfer facet mirror 6. Moreover, it is possible to prevent the individual mirror subgroups from having a disadvantageous form of an edge contour in respect of a stability of the illumination. It is preferable if the edges of the individual mirror groups or of the individual mirror subgroups include an angle α that is greater than 20° with the object displacement direction y. By way of example, this is the case in the individual mirror subgroups 47 to 49. Examples for this angle are denoted by α in FIG. 15.

The use of selection individual mirrors $21_A$ moreover provides the option of designing the individual mirror groups 28 or the individual mirror subgroups in such a way that, where possible, no block interstices 28*a* pass through the individual mirror groups 28 or the individual mirror subgroups. It is possible to achieve the situation where less than 80% of all block interstices 28*a* lie in the interior of individual mirror groups 28 or in the interior of individual mirror subgroups.

Two partial field sections 44, 45 of the object field 8 are illuminated by way of the illumination predefinition facet $25_5$. The partial field section 44, which completely includes the partial field section 41, is delimited by the illumination pole 36 from small and large x-values. The partial field section 45 is delimited by the object field 8 from small x-values and by the illumination pole 40 from large x-values. Once again, individual mirror sub-groups of the assigned individual mirror group 28 on the transfer facet mirror 6 may be allocated on the partial field sections 44, 45.

Figure 16:
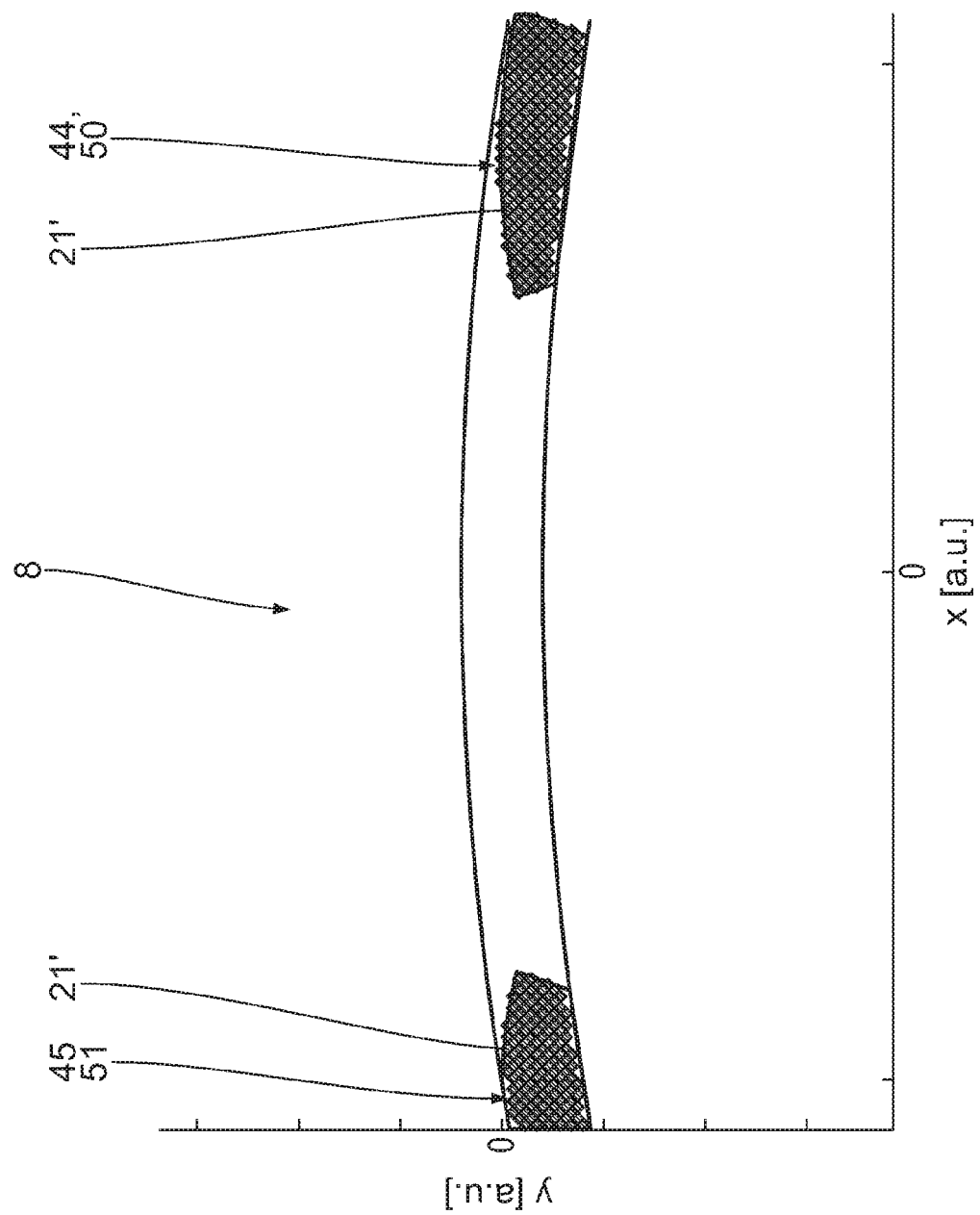
FIG. 16 shows, in an illustration similar to FIG. 9, the impingement of the object field by a partial field by way of an individual mirror group of the transfer facet mirror, including two individual mirror subgroups, in the case of the hexapole illumination setting according to FIG. 12.

FIG. 16 elucidates the position of the partial field sections 44, 45 and the assigned individual mirror subgroups 50, 51 in the object field 8.

The partial field 46 in the object field 8 is subjected to illumination by way of the illumination predefinition facet $25_6$. The partial field 46 is delimited from small x-values by the illumination pole 40 and from large x-values by the object field 8. An individual mirror group 28 on the transfer facet mirror 6 may also be assigned, once again, to the partial field 46.

Figure 18:
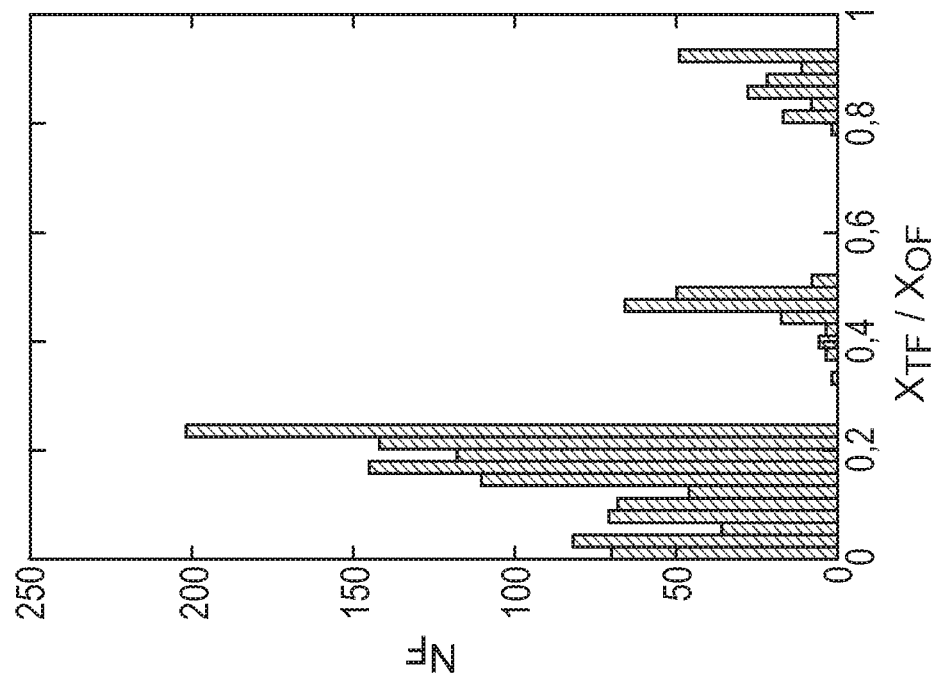
FIG. 18 shows, in an illustration similar to FIG. 11, a frequency distribution of a relative maximum x-extent of the partial fields in the hexapole illumination setting according to FIG. 12.
Figure 17:
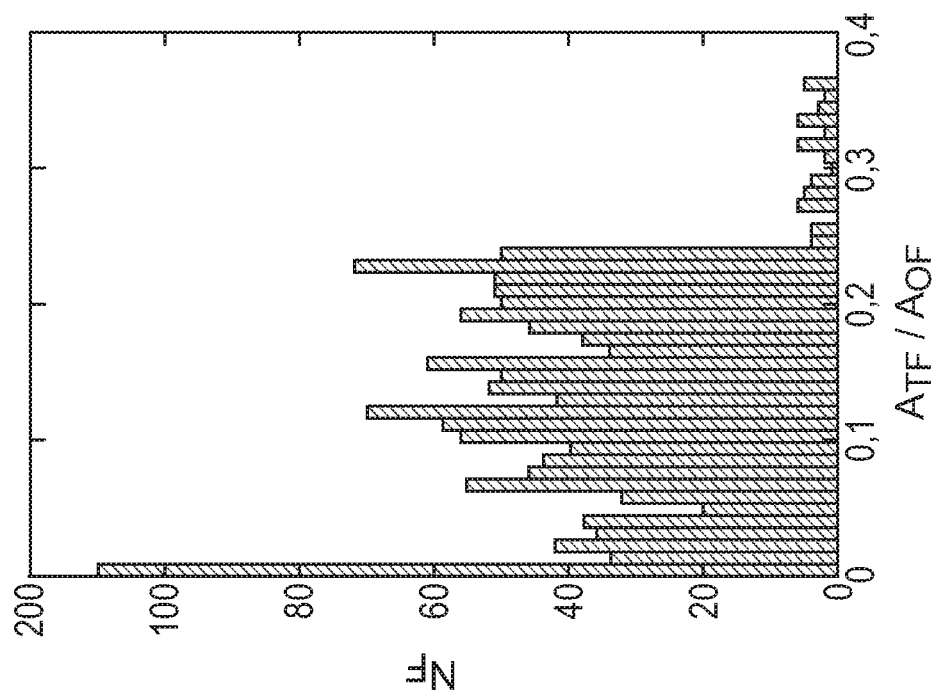
FIG. 17 shows, in an illustration similar to FIG. 10, a frequency distribution of an area segment of the partial fields in the hexapole illumination setting according to FIG. 12.

FIGS. 17 and 18 show frequency distributions corresponding to FIGS. 10 and 11.

The illustration from FIG. 18 once again allows an assignment of the frequencies of illumination predefinition facets, which are subject to illumination by simply contiguous individual mirror groups, by individual mirror groups with two individual mirror subgroups and by individual mirror groups with three individual mirror subgroups, of the transfer facet mirror 6.

FIG. 19 shows, as a further example of an illumination setting, a quadrupole illumination setting with a total of 4 illumination poles 52 to 55, which, proceeding from the uppermost illumination pole 52 in FIG. 19, are enumerated clockwise. In a circumferential direction about a pupil center Z, adjacent illumination poles merge into one another by rotation through 90°.

Figure 21:
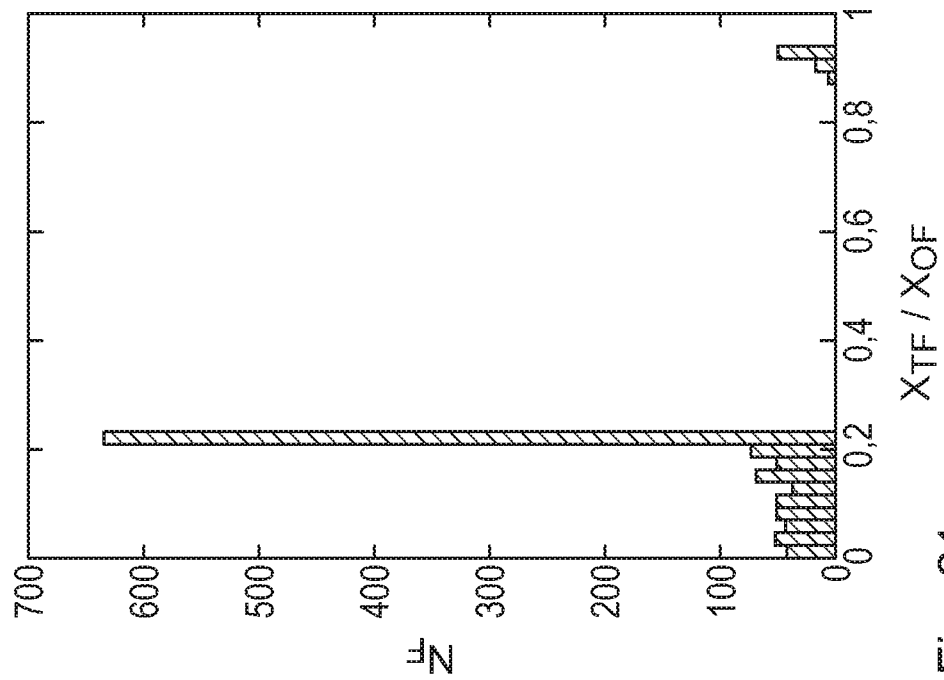
FIG. 21 shows, in an illustration similar to FIG. 11, a frequency distribution of a relative maximum x-extent of the partial fields in the quadrupole illumination setting according to FIG. 19.
Figure 20:
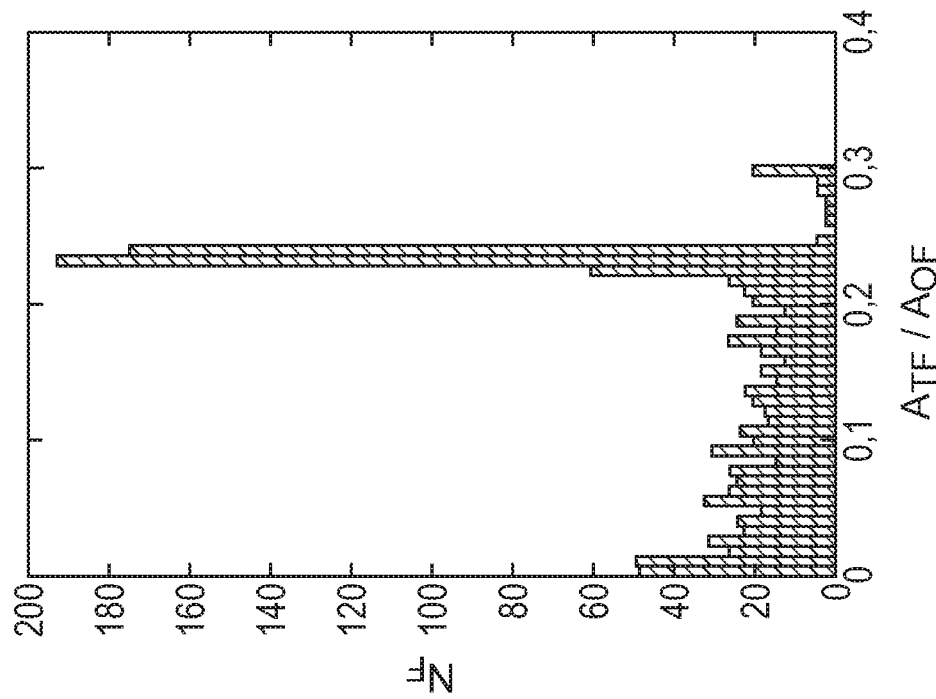
FIG. 20 shows, in an illustration similar to FIG. 10, a frequency distribution of an area segment of the partial fields in the quadrupole illumination setting according to FIG. 19.

In accordance with FIGS. 10 and 11, or 17 and 18, FIGS. 20 and 21 once again show the frequency distributions of the numbers NF of illumination predefinition facets 25 in respect of the ratios $A_{TF}/A_{OF}$ and $X_{TF}/X_{OF}$ for the quadrupole illumination setting according to FIG. 19. As may be gathered from FIG. 21, a portion of illumination predefinition facets 25 which are illuminated via individual mirror groups 28 having two individual mirror subgroups is also present here.

Figure 22:
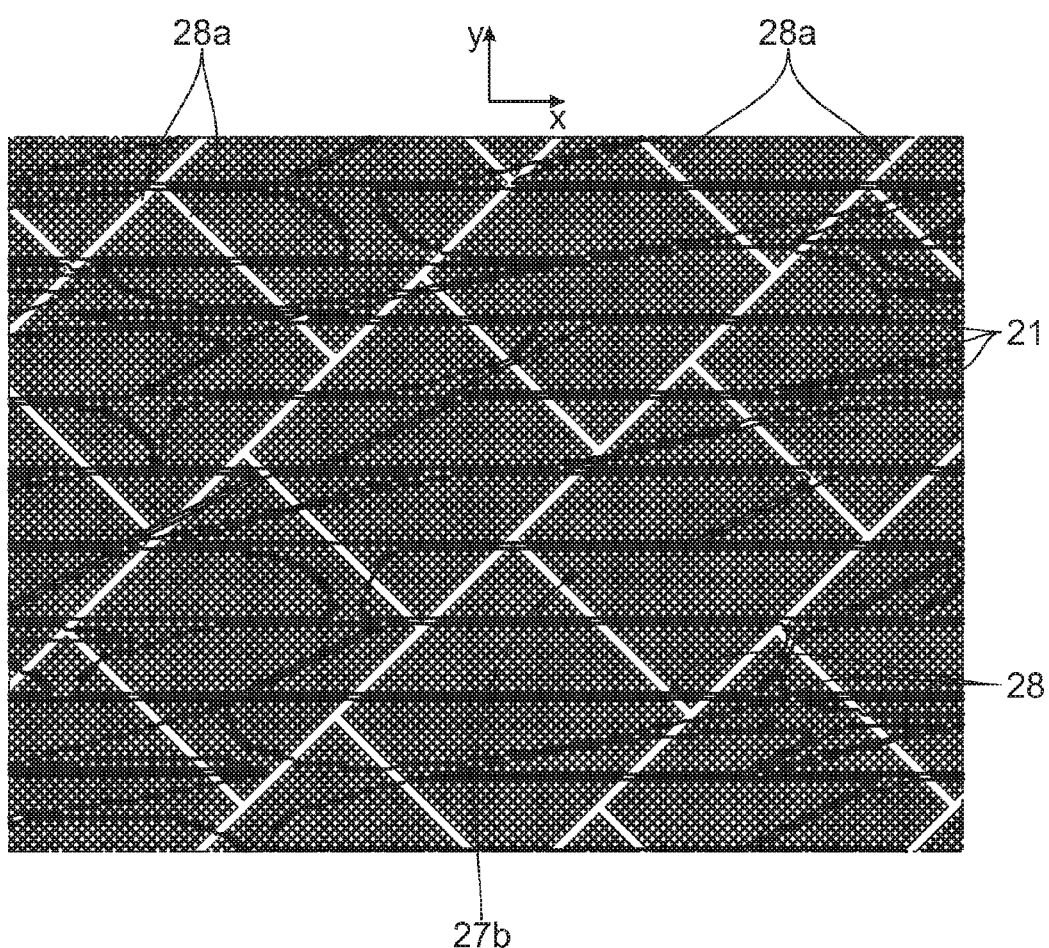
FIG. 22 shows, in an illustration similar to FIG. 4, a distribution of individual mirror groups on the transfer facet mirror for a y-dipole illumination setting.

FIG. 22 shows a section of a subdivision of the transfer facet mirror 6 into individual mirror groups or transfer facet groups 28 for a y-dipole illumination setting which corresponds to the x-dipole setting according to FIG. 6 with illumination poles that are rotated through 90° about a center of the pupil 12*a*, i.e. which are spaced apart from one another in the y-direction. In comparison with the subdivision of the transfer facet groups 28 according to FIG. 4, significantly more transfer facet groups 28 whose images in the object field 8 fill the entire x-extent thereof are present in the case of the subdivision according to FIG. 22.

FIG. 22 shows transfer facets 21 of square shape, the edges of which are rotated by 45° relative to the scan direction. The same holds true for the likewise square individual mirror blocks 27*b*, the edges of which are once again visible by virtue of thick, white block interstices 28*a*, then running obliquely.

In the case of the occupation of the transfer facet mirror 6 with transfer facet groups 28 according to FIG. 4, less than 7% of all the transfer facets 21 of the transfer facet mirror 6 are not used, that is to say do not contribute to the illumination of the downstream illumination predefinition facet mirror 7. This correspondingly also holds true for the occupation according to FIG. 22.

In the case of the occupation according to FIG. 22, the number of transfer facet groups 28 present is approximately half that in the case of the occupation according to FIG. 4.

In the case of the occupation according to FIG. 22, the transfer facet groups 28 deviate more often from the rectangular shape.

In order to determine the assignments of the individual mirror groups 28 of the transfer facet mirror 6 to the illumination predefinition facets 25 of the illumination predefinition facet mirror 7 for the purposes of illuminating the object field 8, an illumination intensity distribution in the illumination pupil 12a, i.e. an illumination setting, is initially predefined. Furthermore, the extent of the illumination field, including an edge contour, is predefined; it regularly corresponds to the extent of the object field 8. Then, a start is made by selecting a first illumination predefinition facet 25 and a check is carried out, in particular via a corresponding stop structure or via a geometric consideration explained above e.g. on the basis of FIG. 8, as to which individual mirrors 21 of the transfer facet mirror 6 may be used to subject this illumination predefinition facet 25 of the illumination pre definition facet mirror 7 to illumination for the purposes of illuminating at least one region or part of the object field 8 with the illumination light 3. Subsequently, the individual mirrors 21, in which the check has resulted in a corresponding illumination solution, are allocated to the individual mirror group 28 which is assigned to the selected illumination predefinition facet 25. This selection, check and allocation is then repeated for all illumination predefinition facets 25, at least for all illumination predefinition facets 25 which are usable for the predefined illumination setting.

A smaller individual mirror group instead of a maximum possible individual mirror group size may be formed during the allocation, at least in some individual mirror groups, for the purposes of reducing a thermal load, improving a far-field coverage in the transfer facet mirror or else reducing entrainment of otherwise imaged block interstices. On account of the very variable form of the virtual field facets, i.e. the individual mirror groups 28 (cf. e.g. FIG. 4), it is not possible to avoid the situation that individual first individual mirrors 21 are not able to be assigned to any individual mirror group and hence cannot be imaged into the object field via an illumination predefinition facet 25 despite the high packing density of greater than 80%. These non-assigned individual mirrors 21D, which are not enclosed by the boundary lines of the individual mirror groups 28 in FIG. 4 (cf., for example, individual mirror $21_D$ in FIG. 4), are present with a very uniform distribution over the transfer facet mirror 6. Therefore, these may be used to measure the light power provided by the light source 2, which is not constant in time, during the exposure of the wafer 19. Hence, the source power may be regulated by way of a control loop and it is possible to ensure a dose in the photoresist on the wafer 19 which is constant in time. To this end, the light of these dose individual mirrors $21_D$ is guided either directly to one or more detectors or else using further mirrors, such as e.g. the illumination predefinition facets 25. If use is made of a plurality of detectors, detectors with a spatial resolution or coupling of the light 3 of the dose individual mirrors $21_D$ which is separate in time from the projection exposure, it is possible to measure the spatial emission distribution of the light source 2 in addition to the overall power thereof. This may be used for a qualitatively better assignment of individual mirror groups 28 to illumination predefinition facets 25. The selection of the dose individual mirrors $21_D$ is variable and adapted in the case of each new mirror assignment.

In order to produce a microstructured component, in particular a highly integrated semiconductor component, for example a memory chip, with the aid of the projection exposure apparatus 1, firstly the reticle 12 and the wafer 19 are provided. Afterwards, a structure on the reticle 12 is projected onto a light-sensitive layer on the wafer 19 via the projection optical unit of the projection exposure apparatus 1. With the development of the light-sensitive layer, then a microstructure is produced on the wafer 19 and the micro- or nanostructured component is produced therefrom.

What is claimed is:

1. An illumination optical unit configured to illuminate an object field with EUV illumination light, the illumination optical unit comprising:
    a field facet mirror comprising a plurality of individual mirrors arranged next to each other, the individual mirrors being individually tilted and grouped to define individual mirror groups which are tiltable together to define an illumination of the object field; and
    a second facet mirror comprising a plurality of individually tiltable second facets arranged next to each other, wherein:
        the field and second facet mirrors are configured to reflectively overlay partial beams of a beam of the EUV illumination light, in each case via exactly one of the second facets, to guide the partial beams to the object field;
        the second facet mirror is arranged between a pupil plane of the illumination optical unit and a second plane of the illumination optical unit;
        the second plane is a field plane of the illumination system or a plane that is conjugate to a field plane of the illumination system;
        the individual mirror groups comprise a first individual mirror group that is configured to guide a partial beam to the object field via exactly one of the second facets; and
        the first individual mirror group comprises a plurality of individual mirror subgroups that are not contiguous.

2. The illumination optical unit of claim 1, wherein the individual mirror groups cover more than 80% of a far field of the beam of the EUV illumination light.

3. The illumination optical unit of claim 2, wherein:
    the second facet mirror comprises more than 100 second facets; and
    for more than 1% of the individual mirror groups:
        each individual mirror group is configured to guide a partial beam to the object field via exactly one of the second facets; and
        each individual mirror group comprises a plurality of individual mirror subgroups that are not contiguous.

4. The illumination optical unit of claim 1, wherein:
    the individual mirror groups are assigned to the second facets so that individual mirrors of a first individual mirror group are displaceable between:
        a first tilting position in which the individual mirrors reflect illumination light to a first one of the second facets; and
        a second tilting position in which the individual mirrors reflect illumination light to a second one of the second facets; and
    the first one of the second facts and/or the second one of the second facets is configured to guide the EUV illumination light from:
        the individual mirrors of the first individual mirror group to the object field; and
        a second individual mirror group to the object field.

5. The illumination optical unit of claim 4, wherein the second facet mirror comprises more than 100 second facets, and more than 1% of the individual mirror groups are arranged non-contiguously.

6. The illumination optical unit of claim 1, wherein:
the illumination optical unit is configured so that, during use of the illumination optical unit, an object in the object field is displaced in a displacement direction; and
the individual mirror groups are delimited so that edges of the individual mirror groups include an angle of greater than 20° with the object displacement direction.

7. The illumination optical unit of claim 6, wherein the second facet mirror comprises more than 100 second facets, and more than 1% of the individual mirror groups are arranged non-contiguously.

8. The illumination optical unit of claim 1, wherein:
the field facet mirror comprises a plurality of individual mirror blocks;
in each case, a block interstice is present between two of the individual mirror blocks;
the block interstice has greater extent than a mirror interstice between two neighboring individual mirrors within one of the individual mirror blocks;
less than 80% of all block interstices lie in the interior of individual mirror groups.

9. The illumination optical unit of claim 8, wherein the second facet mirror comprises more than 100 second facets, and more than 1% of the individual mirror groups are arranged non-contiguously.

10. The illumination optical unit of claim 1, wherein the second facet mirror comprises more than 100 second facets, and more than 1% of the individual mirror groups are arranged non-contiguously.

11. The illumination optical unit of claim 1, wherein:
the illumination optical unit is configured so that, during use of the illumination optical unit, an object in the object field is displaced in a displacement direction; and
the individual mirror subgroups are delimited so that edges of the individual mirror subgroups include an angle of greater than 20° with the object displacement direction.

12. The illumination optical unit of claim 11, wherein the second facet mirror comprises more than 100 second facets, and more than 1% of the individual mirror groups are arranged non-contiguously.

13. The illumination optical unit of claim 1, wherein:
the field facet mirror comprises a plurality of individual mirror blocks;
in each case, a block interstice is present between two of the individual mirror blocks;
the block interstice has greater extent than a mirror interstice between two neighboring individual mirrors within one of the individual mirror blocks;
less than 80% of all block interstices lie in the interior of individual mirror subgroups.

14. The illumination optical unit of claim 13, wherein the second facet mirror comprises more than 100 second facets, and more than 1% of the individual mirror groups are arranged non-contiguously.

15. An optical system, comprising:
an illumination optical unit according to claim 1; and
a projection optical unit configured to image the object field into an image field.

16. An illumination system, comprising:
an illumination optical unit according to claim 1; and
a light source.

17. An apparatus, comprising:
an illumination optical unit according to claim 1;
a projection optical unit configured to image the object field into an image field; and
a light source,
wherein the apparatus is a projection exposure apparatus.

18. A method of using a projection exposure apparatus comprising an illumination optical unit and a projection optical unit, the method comprising:
using the illumination optical unit to illuminate a section of a reticle; and
using the projection optical unit to project the illuminated section of the reticle onto a material sensitive to the EUV illumination light,
wherein the illumination optical unit is an illumination optical unit according to claim 1.

19. A method, comprising:
a) providing an illumination optical unit according to claim 1;
b) defining an illumination intensity distribution in an illumination pupil;
c) defining an illumination or object field extent including an edge contour of the object field;
d) selecting a first one of the second facets of the second facet mirror;
e) checking which individual mirrors of the field facet mirror may be used to apply the EUV illumination light to the selected second fact for the purposes of illuminating at least some of the illumination or object field;
f) allocating individual mirrors which yielded an illumination solution during e) to the individual mirror group which is assigned to the selected second facet; and
g) repeating d) to f) for all the second facets of the second facet mirror.

20. The method of claim 19, comprising, for at least some of the individual mirror groups, forming an individual mirror group having a size that is less than a maximum possible individual mirror group size for illuminating the object field.

* * * * *

UNITED STATES PATENT AND TRADEMARK OFFICE
CERTIFICATE OF CORRECTION

PATENT NO. : 9,977,335 B2  
APPLICATION NO. : 15/440265  
DATED : May 22, 2018  
INVENTOR(S) : Martin Endres Page 1 of 1

It is certified that error appears in the above-identified patent and that said Letters Patent is hereby corrected as shown below:

On the Title Page

Column 1, (Notice), Line 3, after "0 days." delete "days.".

In the Specification

Column 12, Line 44, delete "pre-definition" insert --predefinition--.

Signed and Sealed this  
Twenty-third Day of October, 2018

Andrei Iancu  
*Director of the United States Patent and Trademark Office*